(12) United States Patent
Wang et al.

(10) Patent No.: US 7,285,492 B2
(45) Date of Patent: Oct. 23, 2007

(54) METHOD FOR PROCESSING SUBSTRATE

(75) Inventors: Xinming Wang, Tokyo (JP); Daisuke Takagi, Tokyo (JP); Akihiko Tashiro, Tokyo (JP); Yukio Fukunaga, Tokyo (JP); Akira Fukunaga, Tokyo (JP); Akira Owatari, Tokyo (JP); Yukiko Nishioka, Tokyo (JP); Tsuyoshi Sahoda, Tokyo (JP)

(73) Assignee: Ebara Corporation, Tokyo (JP)

( * ) Notice: Subject to any disclaimer, the term of this patent is extended or adjusted under 35 U.S.C. 154(b) by 235 days.

(21) Appl. No.: 11/039,967

(22) Filed: Jan. 24, 2005

(65) Prior Publication Data

US 2005/0245080 A1    Nov. 3, 2005

(30) Foreign Application Priority Data

Jan. 23, 2004    (JP)    ............................. 2004-016379
Jun. 29, 2004    (JP)    ............................. 2004-192060
Jun. 29, 2004    (JP)    ............................. 2004-192061

(51) Int. Cl.
*H01L 21/44*    (2006.01)

(52) U.S. Cl. ...................... 438/674; 438/677; 438/678; 438/687; 134/3

(58) Field of Classification Search ................ 438/674, 438/677, 678, 687; 134/1, 1.3, 2, 3, 41
See application file for complete search history.

(56) References Cited

U.S. PATENT DOCUMENTS 5,167,992 A * 12/1992 Lin et al. .................... 427/437
5,405,656 A * 4/1995 Ishikawa et al. ............. 427/500
6,514,921 B1 * 2/2003 Kakizawa et al. ........... 510/175
6,562,657 B1 * 5/2003 Lin ............................. 438/113
6,593,224 B1 * 7/2003 Lin ............................. 438/618
6,653,170 B1 * 11/2003 Lin ............................. 438/117
6,660,626 B1 * 12/2003 Lin ............................. 438/618
7,060,618 B2 * 6/2006 Inoue et al. ................. 438/687

FOREIGN PATENT DOCUMENTS

JP    11-124680    5/1999
JP    2003-34876    2/2003
JP    2003-193246    7/2003
JP    2003-224128    8/2003

* cited by examiner

*Primary Examiner*—M. Wilczewski
*Assistant Examiner*—Khanh Duong
(74) *Attorney, Agent, or Firm*—Wenderoth, Lind & Ponack, L.L.P.

(57) ABSTRACT

A substrate processing method can securely form a metal film by electroless plating on an exposed surface of a base metal, such as interconnects, with increased throughput and without the formation of voids in the base metal. The substrate processing method includes: cleaning a surface of a substrate having a base metal formed in the surface with a cleaning solution comprising an aqueous solution of a carboxyl group-containing organic acid or its salt and a surfactant as an additive; bringing the surface of the substrate after the cleaning into contact with a processing solution comprising a mixture of the cleaning solution and a solution containing a catalyst metal ion, thereby applying the catalyst to the surface of the substrate; and forming a metal film by electroless plating on the catalyst-applied surface of the substrate.

9 Claims, 28 Drawing Sheets

F I G. 2
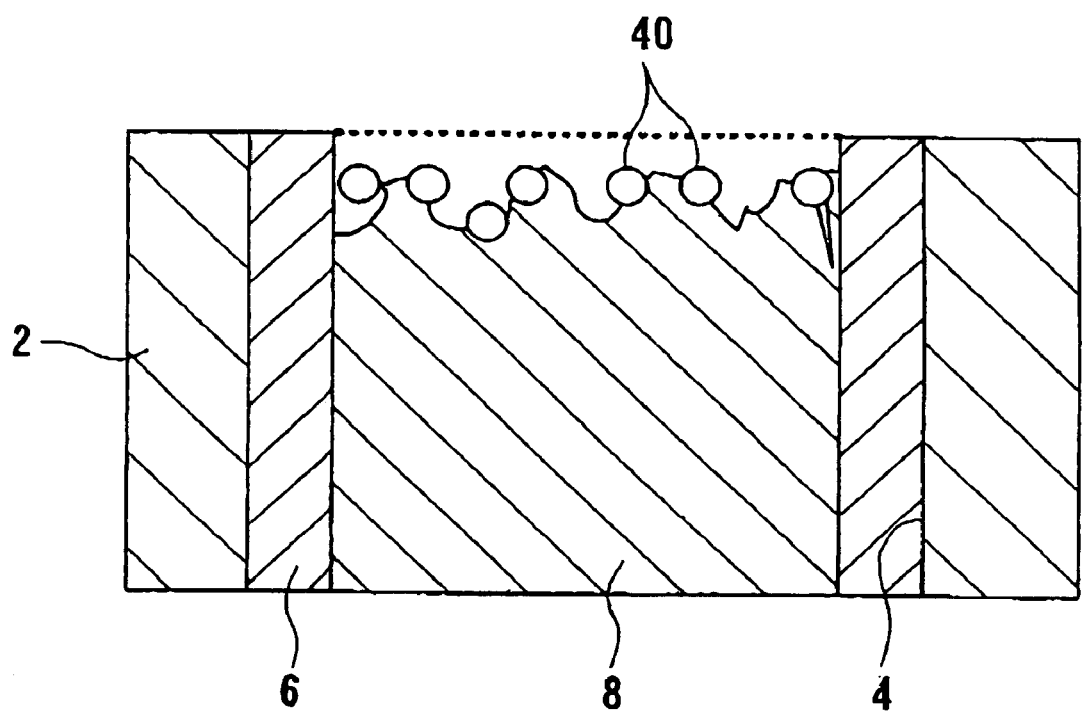

F I G. 6
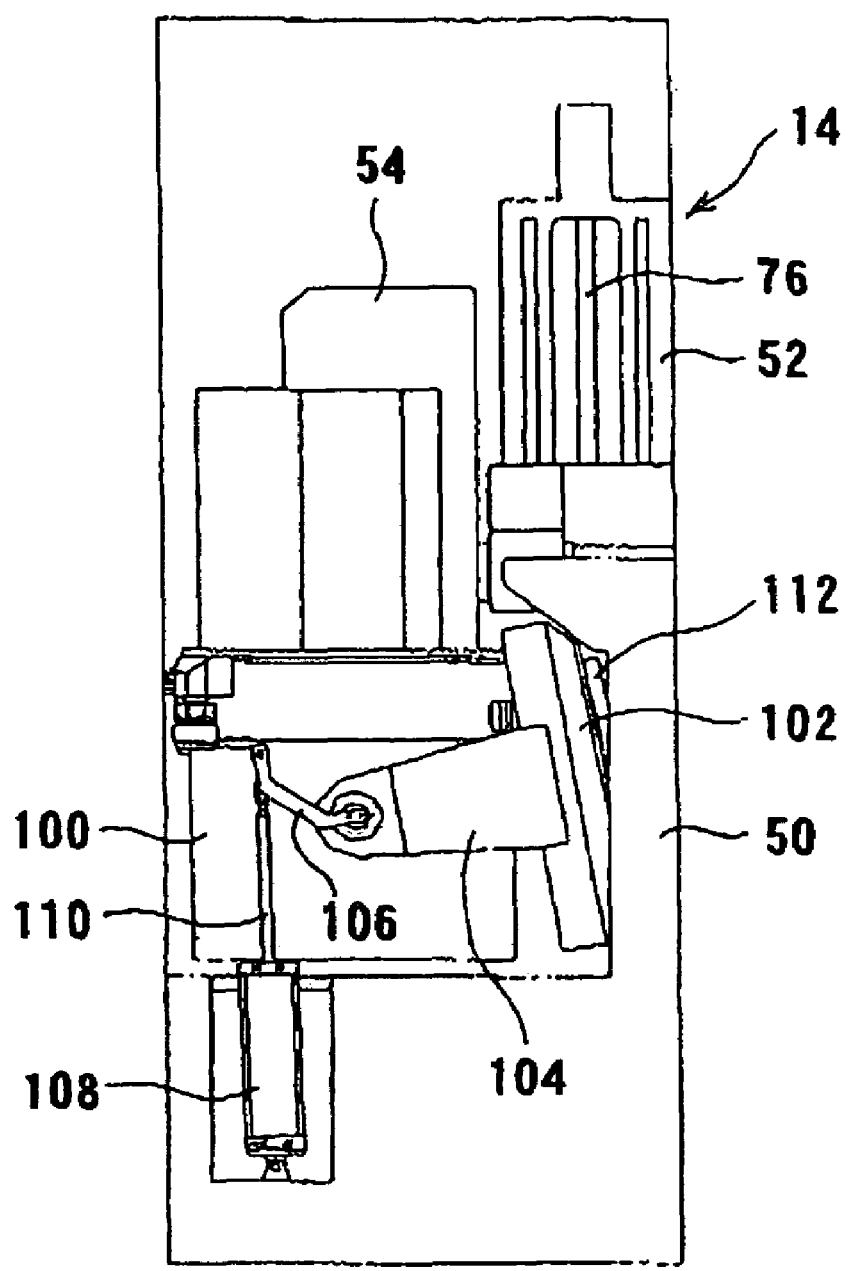

F I G. 9
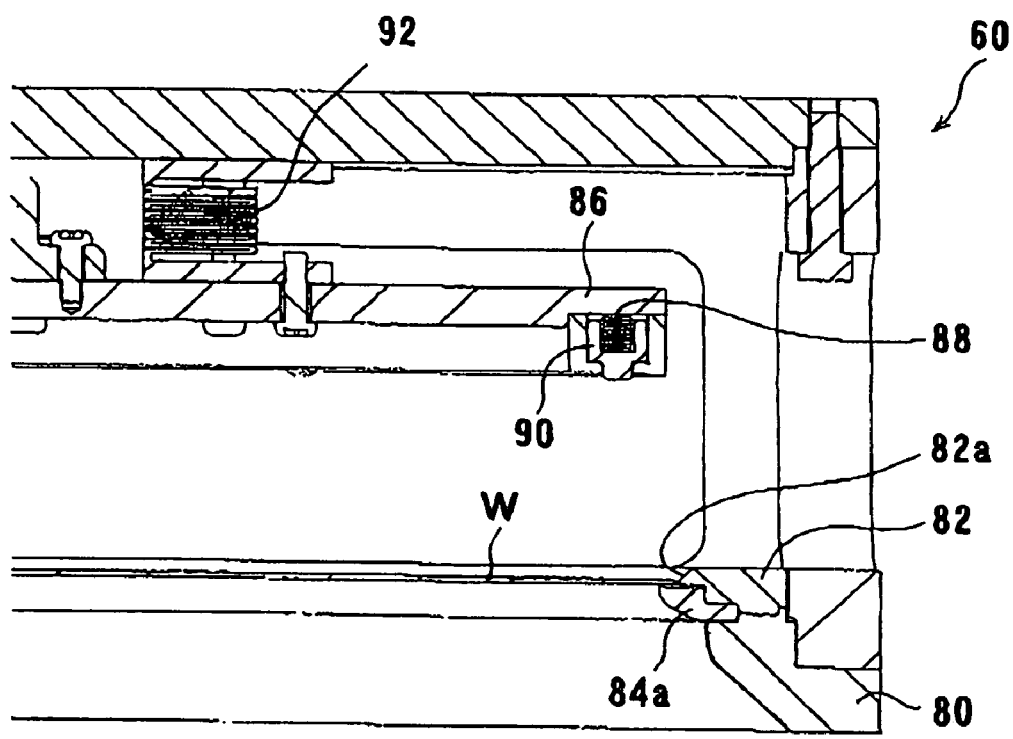

F I G. 1 2
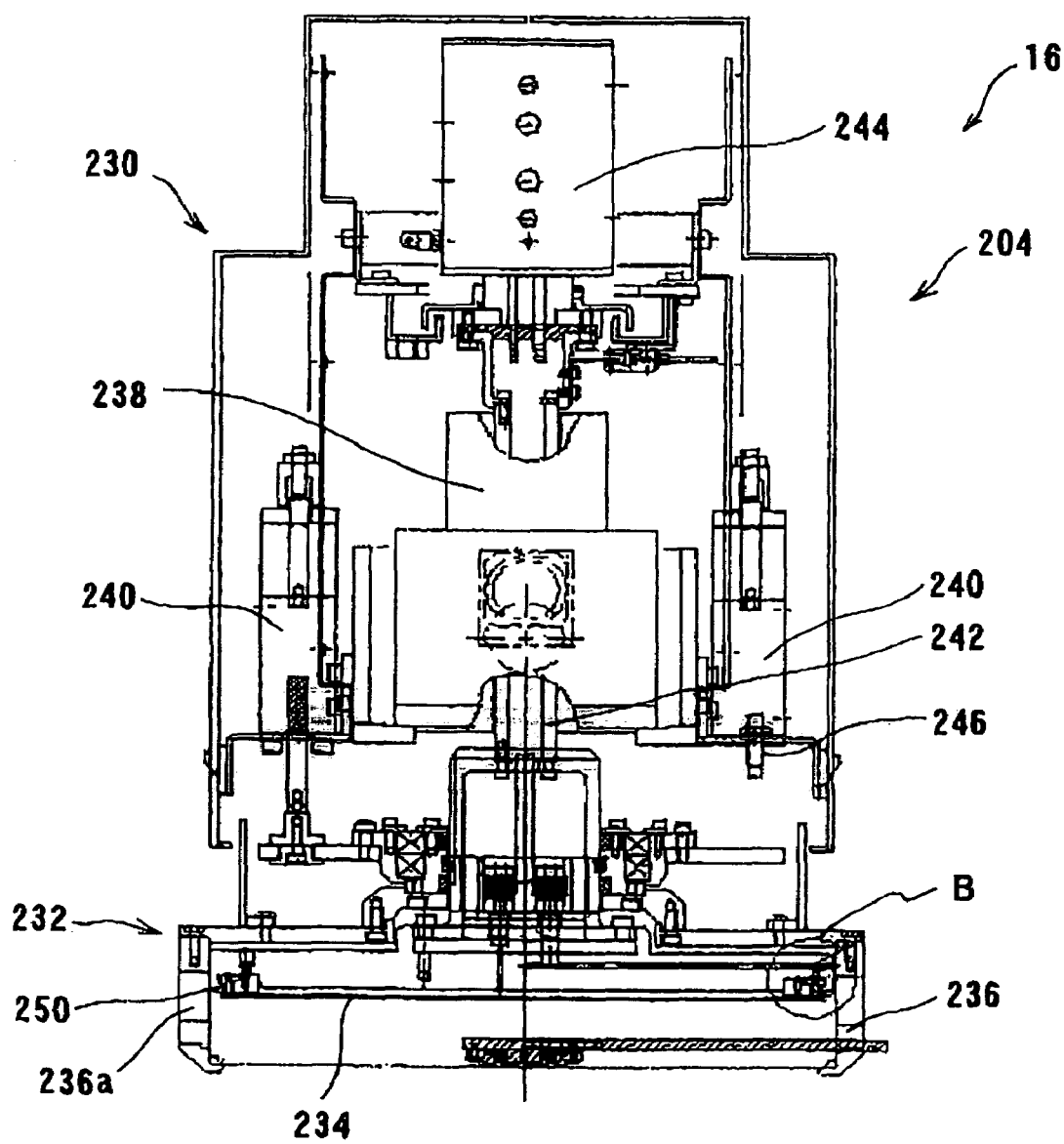

F I G. 2 5
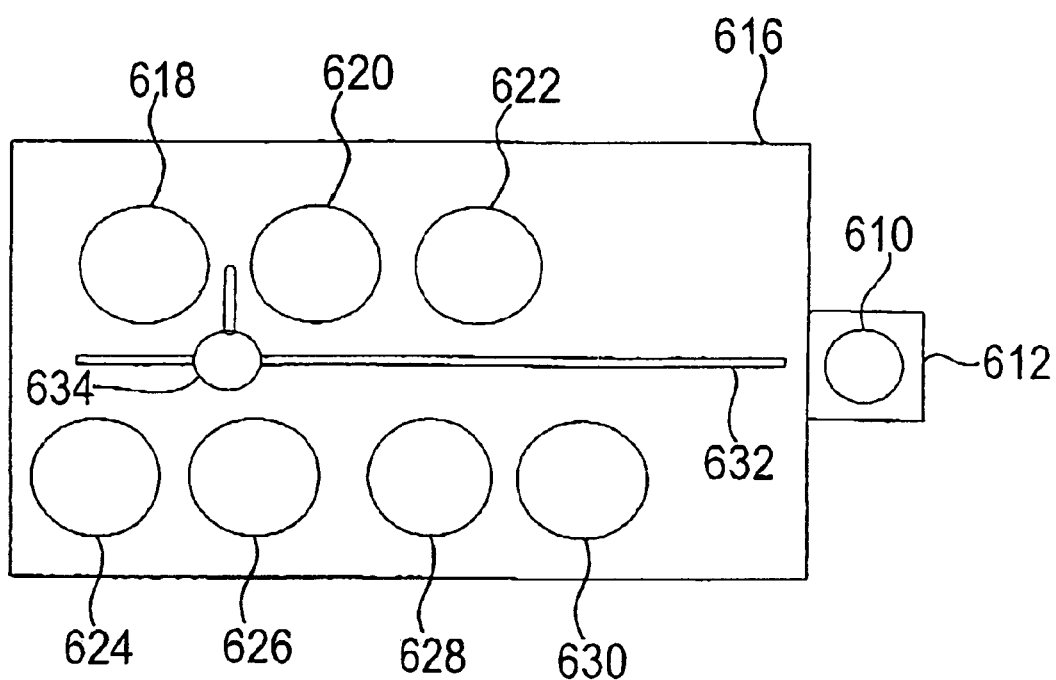

METHOD FOR PROCESSING SUBSTRATE

BACKGROUND OF THE INVENTION

1. Field of the Invention

The present invention relates to a method and apparatus for processing a substrate, and more particularly to a method and apparatus for forming a substrate, which is useful for forming a protective film by electroless plating selectively on exposed surfaces of embedded interconnects of a conductive material (interconnect material), such as copper or silver, embedded in fine interconnect recesses provided in a surface of a substrate, such as a semiconductor wafer, so as to cover and protect the interconnects with the protective film. The method and apparatus for processing a substrate of the present invention is also useful for forming a conductive film, having a function of preventing thermal diffusion of an interconnect material into an interlevel dielectric film or a function of enhancing adhesion between interconnects and an interlevel dielectric film, on bottoms and sides of embedded interconnects.

2. Description of the Related Art

As an interconnect formation process for semiconductor devices, there is getting employed a process (so-called damascene process) in which metal (interconnect material) is embedded in interconnect trenches and contact holes. This process includes embedding aluminum or, recently, metal such as copper or silver in interconnect recesses, such as trenches and contact holes, which have previously been formed in an interlevel dielectric film, and then removing excessive metal by chemical-mechanical polishing (CMP) so as to flatten a surface of the substrate.

Conventionally, in a case of such interconnects, for example, copper interconnects, which use copper as an interconnect material, there has been employed a method in which a barrier layer is formed on bottom surfaces and side surfaces of the interconnects to prevent thermal diffusion of the interconnects (copper) into an interlevel dielectric film and to improve electromigration resistance of the interconnects so as to improve the reliability, or a method in which an anti-oxidizing film is formed to prevent oxidation of the interconnects (copper) under an oxidizing atmosphere so as to produce a semiconductor device having a multi-level interconnect structure in which insulating films (oxide films) are subsequently laminated. Generally, metal such as tantalum, titanium, or tungsten, or nitride thereof has heretofore been used as this type of barrier layer. Nitride of silicon has generally been used as an anti-oxidizing film.

As an alternative of the above methods, there has been studied a method in which bottom surfaces and side surfaces or exposed surfaces of embedded interconnects are selectively covered with a protective film (interconnects-protective film) made of a cobalt alloy, a nickel alloy, or the like, to prevent thermal diffusion, electromigration, and oxidation of the interconnects. With regard to a non-volatile magnetic memory, it has been proposed that portions around memory interconnects are covered with a magnetic film such as a cobalt alloy or a nickel alloy in order to prevent a writing current from increasing due to miniaturization. For example, a cobalt alloy, a nickel alloy, and the like, are obtained by electroless plating.

FIGS. 1A through 1D illustrate, in a sequence of process steps, an example of forming copper interconnects in a semiconductor device. First, as shown in FIG. 1A, an insulating film (interlevel dielectric film) 2, such as an oxide film of $SiO_2$ or a film of low-k material, is deposited on a conductive layer 1a formed on a semiconductor base 1 having formed semiconductor devices. Contact holes 3 and trenches 4 are formed in the insulating film 2 by performing a lithography/etching technique so as to provide fine interconnect recesses. Thereafter, a barrier layer 5 of TaN or the like is formed on the insulating film 2, and a seed layer 6 as a feeding layer for electroplating is formed on the barrier layer 5 by sputtering or the like.

Then, as shown in FIG. 1B, copper plating is performed onto a surface of a substrate W to fill the contact holes 3 and the trenches 4 with copper and, at the same time, deposit a copper film 7 on the insulating film 2. Thereafter, the barrier layer 5, the seed layer 6 and the copper film 7 on the insulating film 2 are removed by chemical-mechanical polishing (CMP) or the like so as to leave copper filled in the contact holes 3 and the trenches 4, and have a surface of the insulating film 2 lie substantially on the same plane as this copper. Interconnects (copper interconnects) 8 composed of the seed layer 6 and the copper film 7 are thus formed in the insulating film 2, as shown in FIG. 1C.

Then, as shown in FIG. 1D, electroless plating is performed onto a surface of the substrate W to selectively form a protective film (cap material) 9 of a CoWP alloy on surfaces of interconnects 8, thereby covering and protecting the surfaces of the interconnects 8 with the protective film 9.

There will be described a process of forming a protective film (cap material) 9 of such a CoWP alloy film selectively on surfaces of interconnects 8 by using a conventional electroless plating method. First, the substrate W such as a semiconductor wafer, which has been carried out a CMP process, is immersed, for example, in dilute sulfuric acid having an ordinary temperature for about one minute to remove impurities such as a metal oxide film on a surface of an insulating film 2 and CMP residues such as of copper. After the surface of the substrate W is cleaned with a cleaning liquid such as pure water, the substrate W is immersed, for example, in a $PdSO_4/H_2SO_4$ mixed solution or $PdCl_2/HCl$ mixed solution having an ordinary temperature for about one minute to adhere Pd as a catalyst to the surfaces of the interconnects 8 so as to activate exposed surfaces of the interconnects 8.

After the surface of the substrate W is cleaned (rinsed) with pure water or the like, the substrate W is immersed, for example, in a CoWP plating solution at the solution temperature of 80° C. for about 120 seconds to carry out electroless plating selectively on surfaces of the activated interconnects 8. Thereafter, the surface of the substrate W is cleaned with a cleaning liquid such as pure water, and dried. Thus, a protective film 9 made of a CoWP alloy film is formed selectively on the exposed surfaces of interconnects 8 so as to protect interconnects 8.

SUMMARY OF THE INVENTION

The application of a catalyst such as Pd, in principle, is effected through a displacement reaction caused by electrons ($e^+$) that are emitted from interconnects (base metal) upon etching thereof, i.e. through the so-called "displacement plating". Accordingly, as shown in FIG. 2, when applying a catalyst metal (seeds) 40, such as Pd, to the surfaces of interconnects 8, the interconnects 8 as a base metal can be etched excessively especially at weak crystal grain boundaries. The excessive etching of interconnects 8 may result in the formation of voids in the interconnects 8 and deterioration of the physical properties, which would lower the reliability of the interconnects 8 and increase the resistance of the interconnects. This leads to difficulty in establishing a practical process.

In particular, when a substrate is immersed in, for example, a PdSO$_4$/H$_2$SO$_4$ mixed solution in order to form a Pd catalyst layer on the surfaces of interconnects of e.g. copper, the copper is etched and electrons are emitted, and Pd$^{2+}$ ions receive the electrons whereby the Pd catalyst layer is formed, as shown by the following formulas (2) and (3). Therefore, copper can be etched excessively especially along the weak crystal grain boundaries of copper or along the interfaces between the interconnects and a barrier layer.

$$Cu \rightarrow Cu^{2+} + 2e^- \quad (2)$$

$$Pd^{2+} + 2e^- \rightarrow Pd \quad (3)$$

If the time after CMP processing until the formation of a protective film on interconnects to protect the interconnects is long, the surface conditions of the interconnects after CMP can change, which will adversely affect a pre-plating processing of the substrate as carried out prior to electroless plating. Further, if a post-CMP processing and a pre-electroless plating processing are carried out by separate apparatuses, the processing efficiency will be lowered because of the duplication of similar process steps.

In the formation of a protective film on interconnects, in general, a substrate after CMP is transported to an electroless plating apparatus including a pre-plating processing unit for carrying out pre-plating processing, such as catalyst application, and an electroless plating unit, and pre-plating processing and electroless plating of the substrate are carried out successively. Accordingly, the surface or internal conditions of interconnects, for example copper interconnects, can change due to the storage time of substrate after CMP, the storage environment, etc. This may lower the reliability of the interconnects. Furthermore, a protective film may not be produced stably in the proceeding electroless plating step.

In addition, the installation of a pre-processing unit, besides an electroless plating unit, in an electroless plating apparatus not only increases the footprint of the apparatus, but can also decrease the throughput of plating. Further, in case a post-CMP processing and a pre-electroless plating processing of a substrate are carried out by using separate apparatuses, the processing efficiency will be further lowered because of the duplication of similar process steps.

In order to prevent a protective film from being formed on an insulating film, it is necessary to remove CMP residues, such as copper remaining on the insulating film, for example. The removal of CMP residues is generally carried out by using an inorganic acid, such as HF, H$_2$SO$_4$ or HCl. When such processing liquid contains dissolved oxygen in a large amount, a surface of a substrate is likely to be oxidized. The oxidation of the surface of the substrate will adversely affect the electrical properties of interconnects after the processing.

The present invention has been made in view of the above situation. It is therefore a first object of the present invention to provide a method and apparatus for processing a substrate, which can securely form a metal film by electroless plating on an exposed surface of a base metal, such as interconnects, with increased throughput and without the formation of voids in the base metal.

It is a second object of the present invention to provide a method and apparatus for processing a substrate, which can stably form a metal film (protective film) by electroless plating on the surfaces of interconnects after CMP with increased throughput and without lowering of the reliability of interconnects.

Further, it is a third object of the present invention to provide a method and apparatus for processing a substrate which, by carrying out pre-processing, such as catalyst application or pre-cleaning, with a processing solution optimized for a base metal, can efficiently form a high-quality protective film without deterioration of the electrical properties of interconnects.

In order to achieve the above objects, the present invention provides a substrate processing method comprising: cleaning a surface of a substrate having a base metal formed in the surface with a cleaning solution comprising an aqueous solution of a carboxyl group-containing organic acid or its salt and a surfactant as an additive; bringing the cleaned surface of the substrate into contact with a processing solution comprising a mixture of the cleaning solution and a solution containing a catalyst metal ion, thereby applying the catalyst to the surface of the substrate; and forming a metal film by electroless plating on the catalyst-applied surface of the substrate.

By carrying out a catalyst application processing with a processing solution (catalyst processing solution) containing, besides a catalyst metal ion, such as Pd ion, a carboxyl group-containing organic acid as a chelating agent, it becomes possible to form, for example, a Pd complex, having a larger size than Pd ion, which hardly enters crystal grain boundaries of e.g. copper constituting interconnects, and interstices, for example between the interconnects and a barrier layer, thereby preventing the copper from being excessively etched locally especially along the weak copper crystal grain boundaries or along the interfaces between the interconnects and the barrier layer. Further, it becomes possible to form a complex with an interconnect material, such as copper, upon catalyst application. The complex can adhere to the surfaces of interconnects, copper crystal grain boundaries, interstices between the interconnects and the barrier layer, etc. The complex can thus function as a protective film. This can prevent the formation of voids in the interconnects, for example composed of copper, thereby preventing a rise in the resistance of the interconnects.

The inclusion of a carboxyl group-containing organic acid (chelating agent) and a surfactant, besides a catalyst metal ion, in the processing solution can stabilize the property of the processing solution (catalyst processing solution), making it possible to circulate and reuse the processing solution. In particular, the chelating agent can form, for example, a stable Pd complex, as described above, and the surfactant can decrease the surface tension between Pd complexes, thereby lowering the possibility of coalescence of Pd complexes. Thus, Pd complexes can be prevented from coalescing and precipitating as fine particles which can adhere to an insulating film, etc. Further, the surfactant can lower the surface tension of the processing solution whereby a Pd complex, for example, can more easily approach the surfaces of interconnects, enabling efficient replacement of copper with Pd on copper interconnects.

The base metal is, for example, embedded interconnects which have been formed by embedding of an interconnect material in interconnect recesses provided in the surface of the substrate, followed by flattening by CMP.

According to the present method, a metal film (protective film) can be formed selectively on the exposed surfaces of such embedded interconnects to protect interconnects while suppressing a rise in the resistance of interconnects.

The catalyst metal ion is, for example, a palladium ion, and the solution containing a catalyst metal ion is, for example, one prepared by dissolving a palladium salt in an aqueous solution of an inorganic or organic acid.

Though various ions, such as Sn ion, Ag ion, Pt ion, etc. may be used as the catalyst metal ion, it is preferred to use Pd ion from the view points of reaction rate, easiness of control, etc.

A variety of methods can be employed for the catalyst application. Examples of usable methods include: (1) a method of immersing a substrate in a processing solution held in a processing tank; (2) a method of spraying a pressurized processing solution from a spray nozzle toward a rotating substrate; (3) spraying a processing solution from a nozzle toward a rotating substrate which is held with its front surface (processing surface) facing upwardly; (4) a method of contacting a porous roll with a surface of a rotating substrate while wetting the substrate, for example, by supplying a processing solution from a nozzle disposed above the substrate, or by allowing a processing solution to ooze out of the porous roll; and (5) a method of immersing a substrate in a processing solution held in a processing tank while creating a flow of the processing liquid.

The carboxyl group-containing organic acid is, for example, citric acid, oxalic acid, malic acid, maleic acid, tartaric acid, glutaric acid, adipic acid, pimelic acid, succinic acid, malonic acid, fumaric acid or phthalic acid, or an organic salt thereof.

Preferably, the cleaning solution further comprises a second chelating agent having a group other than carboxyl group.

The second chelating agent may be at least one of an amino polycarboxylic acid, phosphonic acid, a condensed phosphoric acid, a diketone, an amine, a halide ion, cyanide ion, thiocyanate ion, thiosulfate ion and ammonium ion.

The second chelating agent may also be a polyaminocarboxylic acid or a methylenephosphonic acid, or an ammonium salt thereof.

Examples of the polyaminocarboxylic acid include nitrilotriacetic acid (NTA), diethylenetriamine pentaacetic acid (DTPA), ethylenediamine tetraacetic acid (EDTA), trans-1,2-cyclohexanediamine tetracetic acid (CyDTA) and N-(2-hydroxyethyl) ethylenediamine-N, N', N'-triacetic acid (EDTA-OH), and compounds containing any of them.

Examples of the methylenephosphonic acid include ethylenediamine tetrakis (methylenephosphonic acid) and compounds containing it.

The surfactant is, for example, an ionic long-chain alkyl ester surfactant.

Other usable surfactants include a sulfuric acid ester, such as $C_9H_{19}PhO(CH_2CH_2O)_4SO_3H$, $C_{12}H_{25}O(CH_2CH_2O)_2SO_3H$ or $C_{12}H_{25}O(CH_2CH_2O)_4SO_3H$, or an ammonium salt thereof, and a primary, secondary or tertiary amine salt of a sulfuric acid ester, such as $C_8H_{17}N(CH_3)_3Br$ or $C_{12}H_{25}N(CH_3)_2Br$.

The present invention provides a catalyst processing solution comprising a solution containing a catalyst metal ion, to which a carboxyl group-containing organic acid and a surfactant are added.

Preferably, the catalyst processing solution further comprises a second chelating agent having a group other than carboxyl group.

The present invention provides a substrate processing apparatus comprising: a cleaning unit for cleaning a surface of a substrate having a base metal formed in the surface with a cleaning solution comprising an aqueous solution of a carboxyl group-containing organic acid or its salt and a surfactant as an additive; a catalyst application unit for bringing the surface of the substrate after the cleaning into contact with a processing solution comprising a mixture of the cleaning solution and a solution containing a catalyst metal ion, thereby applying the catalyst to the surface of the substrate; an electroless plating unit for forming a metal film on the surface of the substrate after cleaning; and a unit for cleaning and drying the substrate after the plating processing.

Preferably, the substrate processing apparatus further comprises a CMP unit for polishing and flattening the surface of an interconnect material embedded in interconnect recesses provided in the surface of the substrate.

By thus installing a CMP unit, a catalyst application unit and an electroless plating unit in the same apparatus frame, control of the film quality of a metal film for protecting interconnects, between the respective process steps, can be made with ease, the total throughput can be increased, and the footprint can be decreased.

Preferably, the cleaning unit and the catalyst application unit are integrated into one unit.

By using the cleaning solution for use in the cleaning in the cleaning unit as one of the main components of the processing solution for use in the catalyst application processing in the catalyst application unit, it becomes possible to integrate the cleaning unit and the catalyst application unit into one unit without a fear of cross-contamination. By installing the integrated unit in an apparatus frame housing, for example, a CMP unit and an electroless plating unit therein, it becomes possible to eliminate a post-processing unit (cleaning unit) for carrying out a post-processing (cleaning) after CMP. Further, by installing the integrated unit in, for example, a CMP apparatus, it becomes possible to install only plating and post-plating processing units in an electroless plating apparatus.

The present invention provides another substrate processing method comprising: preparing a substrate by forming interconnect recesses in a surface, and forming a film of an interconnect material on the surface while embedding the interconnect material in the interconnect recesses; removing an extra interconnect material other than the interconnect material in the recesses by chemical-mechanical polishing, thereby forming interconnects composed of the interconnect material in the recesses; bringing the surface of the substrate, immediately after the polishing, into contact with a cleaning solution to remove polishing residues and an oxide film formed in the surfaces of interconnects; bringing the surface of the substrate after the cleaning into contact with a catalyst processing solution to apply a catalyst to the surfaces of interconnects; and cleaning the catalyst-applied substrate surface, followed by drying.

The surfaces of, for example, copper interconnects, to which a catalyst such as Pd has been applied, is generally more stable than the copper surfaces before catalyst application. Thus, by removing polishing residues on a substrate and an oxide film in copper interconnects immediately after polishing, applying a catalyst to the surfaces of interconnects, and cleaning and drying the substrate, oxidation of the surfaces of copper interconnects can be suppressed.

Preferably, the dried substrate is stored in a storage container having a controlled internal atmosphere.

By storing a substrate, after the catalyst application and drying, in a storage container having a controlled internal atmosphere, a change in the surface and interior conditions of interconnects of, for example, copper, which could lower the reliability of the interconnects or exert an uncertain adverse effect on the later formation of a protective film, can be prevented.

The cleaning of the catalyst-applied substrate surface may be carried out by rinsing with pure water, or by cleaning with a chemical solution containing a chelating agent, followed by rinsing with pure water.

Preferably, the storage container is an openable and closable hermetic container capable of controlling at least one of the internal humidity, temperature, oxygen concentration, and floating contaminant.

Such an hermetic container can seal off the interior from the outside and can so control the internal atmosphere as to effectively prevent a change in the surface and interior conditions of interconnects of, for example, copper, thus stabilizing or improving the substrate conditions before plating.

It is preferred to use as the catalyst processing solution a mixture of the cleaning solution and a solution containing a catalyst metal ion.

The use, as a catalyst processing solution, of a mixture of the cleaning solution and a solution containing a catalyst metal ion makes it possible to carry out cleaning of a substrate after CMP with the cleaning solution (chemical solution) and application of a catalyst to the surfaces of interconnects with the catalyst processing solution successively in the same unit while reducing cross-contamination.

The present invention provides yet another substrate processing method comprising: carrying a substrate, in which a catalyst has been applied to the surface of embedded interconnects formed in a surface of the substrate, into an apparatus frame of an electroless plating apparatus; and directly forming a protective film by electroless plating selectively on the surfaces of interconnects of the substrate.

By thus directly forming a protective film by electroless plating on the surfaces of interconnects in an electroless plating apparatus without carrying out the catalyst application processing in the electroless plating apparatus, it becomes possible to increase the throughput of plating and to eliminate the need to install a pre-processing unit in the electroless plating apparatus, thus decreasing the footprint of the apparatus.

Preferably, immediately before carrying the substrate into the apparatus frame of the electroless plating apparatus, the substrate is stored in a storage container having a controlled internal atmosphere.

Preferably, the substrate after the formation of the protective film is subjected to post-processing, followed by drying. The post-processing of the substrate is, for example, chemical cleaning or etching to selectively remove impurities remaining on a nonmetallic surface of the substrate.

This can securely remove plating residues, such as fine metal particles on an interlevel dielectric film, thereby enhancing the selectivity of electroless plating.

Alternatively, the post-processing of the substrate may be plasma processing to selectively remove or modify impurities remaining on a nonmetallic surface of the substrate.

Preferably, at least one of a film thickness and a film property of the protective film is measured after drying and, based on comparison of the measured value with a target value, the processing conditions of electroless plating in the electroless plating apparatus are adjusted.

For example, a film thickness of a protective film formed on the surfaces of interconnects is measured and, based on the difference between the measured value and a target value, the plating time for the next substrate, for example, may be adjusted. A film thickness of a protective film formed on the surfaces of interconnects can thus be controlled.

The present invention provides yet another substrate processing method comprising: preparing a substrate by forming interconnect recesses in a surface, and forming a film of an interconnect material on the surface while embedding the interconnect material in the interconnect recesses; removing an extra interconnect material other than the interconnect material in the recesses by chemical-mechanical polishing, thereby forming interconnects composed of the interconnect material in the recesses; bringing the surface of the substrate, immediately after the polishing, into contact with a cleaning solution to remove polishing residues and an oxide film formed in the surfaces of interconnects; bringing the surface of the substrate after the cleaning into contact with a catalyst processing solution to apply a catalyst to the surfaces of interconnects; and cleaning the catalyst-applied substrate surface, followed by direct formation of a protective film by electroless plating on the surfaces of interconnects of the substrate.

It is preferred that the substrate be dried immediately after the cleaning of the catalyst-applied substrate surface, and stored in a storage container having a controlled internal atmosphere until just before the direct formation of the protective film by electroless plating on the surfaces of interconnects.

The present invention provides another substrate processing apparatus comprising: a chemical-mechanical polishing unit for removing an extra interconnect material other than the interconnect material in interconnect recesses of a substrate, said substrate having been prepared by forming the interconnect recesses in a surface and forming a film of the interconnect material on the surface while embedding the interconnect material in the interconnect recesses, thereby forming interconnects composed of the interconnect material in the recesses; a first cleaning unit for bringing the surface of the substrate into contact with a cleaning solution to remove polishing residues and an oxide film formed in the surfaces of interconnects; a catalyst application unit for bringing the surface of the substrate into contact with a catalyst processing solution to apply a catalyst to the surfaces of interconnects; a second cleaning unit for cleaning the catalyst-applied substrate surface to remove a catalyst metal residue; and a unit for drying the surface of the substrate after the catalyst application and cleaning.

The catalyst processing solution is preferably a mixture of the cleaning solution and a solution containing a catalyst metal ion.

Preferably, the first cleaning unit and the catalyst application unit are integrated into one unit. Alternatively, the first cleaning unit, the catalyst application unit and the second cleaning unit may be integrated into one unit.

The present invention provides yet another substrate processing apparatus comprising an electroless plating unit for selectively forming a protective film by electroless plating on the surfaces of interconnects, to which a catalyst has been applied in a different apparatus, of a substrate.

Preferably, the substrate processing apparatus further comprises a post-processing unit for carrying out post-processing of the substrate after the plating. Alternatively, the substrate processing may further comprise a measurement unit for measuring at least one of a film thickness and a film property of the protective film.

The present invention provides yet another substrate processing apparatus comprising: a chemical-mechanical polishing apparatus; a storage container for storing and transporting the catalyst-applied substrate in a controlled internal atmosphere; and an electroless plating apparatus including an electroless plating unit for forming a protective film selectively on the surfaces of interconnects of the substrate which has been stored and transported in the storage container; wherein said chemical-mechanical polishing apparatus including; a chemical-mechanical polishing unit for removing an extra interconnect material other than the interconnect material in interconnect recesses of a substrate, said substrate having been prepared by forming the interconnect recesses in a surface and forming a film of the interconnect material on the surface while embedding the interconnect material in the interconnect recesses, thereby forming interconnects composed of the interconnect material in the recesses, a first cleaning unit for bringing the surface of the substrate into contact with a cleaning solution to remove polishing residues and an oxide film formed in the surfaces of interconnects, a catalyst application unit for bringing the surface of the substrate into contact with a catalyst processing solution to apply a catalyst to the surfaces of interconnects, a second cleaning unit for cleaning the catalyst-applied substrate surface to remove a catalyst metal residue, and a unit for drying the surface of the substrate after the catalyst application and cleaning.

By using the storage container having a controlled internal atmosphere upon transportation of a substrate from the chemical-mechanical polishing (CMP) apparatus to the electroless plating apparatus, the substrate conditions before plating can be stabilized or improved.

The present invention provides yet another substrate processing apparatus comprising: a chemical-mechanical polishing unit for removing an extra interconnect material other than the interconnect material in interconnect recesses of a substrate, said substrate having been prepared by forming the interconnect recesses in a surface and forming a film of the interconnect material on the surface while embedding the interconnect material in the interconnect recesses, thereby forming interconnects composed of the interconnect material in the recesses; a first cleaning unit for bringing the surface of the substrate into contact with a cleaning solution to remove polishing residues and an oxide film formed in the surfaces of interconnects; a catalyst application unit for bringing the surface of the substrate into contact with a catalyst processing solution to apply a catalyst to the surfaces of interconnects; a second cleaning unit for cleaning the catalyst-applied substrate surface to remove a catalyst metal residue; an electroless plating unit for forming a protective film by electroless plating selectively on the surfaces of interconnects of the substrate; and a unit for drying the substrate.

The present invention provides yet another substrate processing method comprising: pre-processing a surface of a base metal formed in a surface of a substrate with a processing solution containing a catalyst metal ion and a component for forming a complex with the base metal, said component comprising a nitrogen-containing organic compound and/or a carboxyl group-containing organic compound; and forming a metal film by electroless plating selectively on the pre-processed base metal surface.

By cleaning a surface of a base metal with a processing solution containing a component for forming a complex with the base metal, and an acid having a function of cleaning the surface of the base metal, it becomes possible to form a protective layer, comprising a complex of the base metal, in the surface of the base metal simultaneously with removal (cleaning off) of a metal oxide film in the surface of the base metal, CMP residues on the surface of the base metal, etc. Accordingly, when applying a catalyst to the base metal after cleaning, the pre-formed protective layer can prevent the structure of the base metal or the physical properties from being damaged due to etching or the like of the base metal. Further, mixing of impurities into a processing solution containing a catalyst metal can be prevented.

A nitrogen-containing organic compound, because of the polarity of the nitrogen in the molecular structure, is electrostatically attracted to and adsorbed on a base metal. This can prevent excessive reaction of a catalyst metal with the base metal.

Examples of usable nitrogen-containing organic compounds include nitrogen-containing polymers, such as a quaternary salt of polydialkylaminoethyl acrylate, polyallyldimethylammonium chloride, polyethylene imine, a quaternary salt of polyvinyl pyridine, polyvinyl amidine, polyallyl amine and polyamine sulfonic acid.

Such a nitrogen-containing polymer is used in an amount of about 0.01 to 1000 ppm, preferably about 1 to 100 ppm in the processing solution. The molecular weight of the nitrogen-containing polymer is preferably not less than 100, more preferably not less than 1000.

The carboxyl group-containing organic compound preferably has two or more carboxyl groups and/or capability to form a complex with a base metal.

When an organic compound having two or more carboxyl groups is used as the component for forming a complex with a base metal, at least one carboxyl group is adsorbed onto the base metal, whereby a catalyst metal can be prevented from reacting excessively with the base metal. The carboxyl group-containing organic compound is used in an amount of about 0.01 to 100 g/L, preferably about 0.1 to 10 g/L in the processing solution.

Preferably, the processing of the surface of the base metal with the processing solution is carried out in the processing solution having a dissolved oxygen concentration of not more than 3 ppm.

By carrying out the pre-processing of the surface of the base metal in the processing solution having a dissolved oxygen concentration of not more than 3 ppm, reaction of the base metal with dissolved oxygen during processing can be reduced, thus preventing a loss in the reliability of the base metal.

The substrate may be a semiconductor device having an embedded interconnect structure, and the metal film as a protective film may be formed selectively on the surfaces of interconnects as the base metal.

By thus applying the present invention to a semiconductor device having an embedded interconnect structure, it becomes possible to selectively form a metal film (protective film) on the exposed surfaces of interconnects to protect the interconnects without forming voids in the interconnects.

BRIEF DESCRIPTION OF THE DRAWINGS

FIG. 2 is a schematic diagram illustrating the state of a base metal, after catalyst application, as observed in conventional electroless plating;

FIG. 6 is a front view of the integrated unit of the substrate processing apparatus shown in FIG. 3 upon chemical processing;

FIG. 9 is an enlarged view of the portion A of FIG. 8;

FIG. 12 is a cross-sectional view of a substrate head of an electroless plating unit of the substrate processing apparatus shown in FIG. 3 upon transfer of a substrate;

FIG. 25 is a layout plan view of a substrate processing apparatus according to yet another embodiment of the present invention;

DETAILED DESCRIPTION OF THE PREFERRED EMBODIMENTS

Figure 1A:
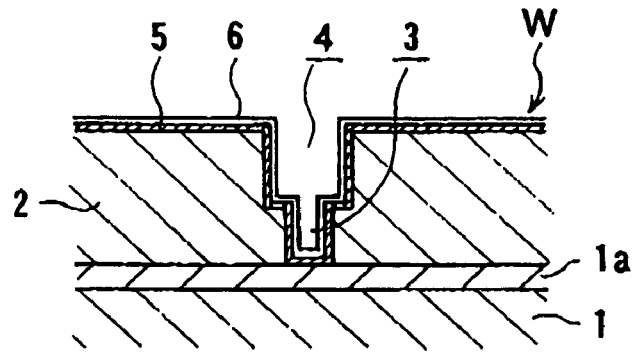
FIGS. 1A through 1D are diagrams illustrating, in a sequence of process steps, an example for forming copper interconnects in a semiconductor device.
Figure 1B:
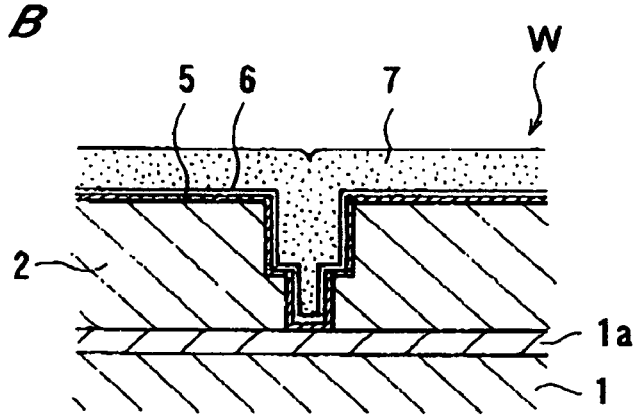
Figure 1C:
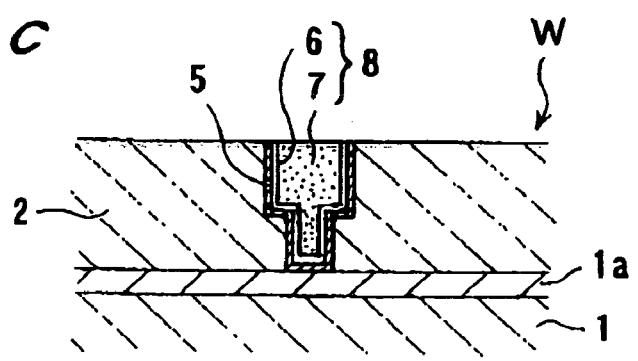
Figure 1D:
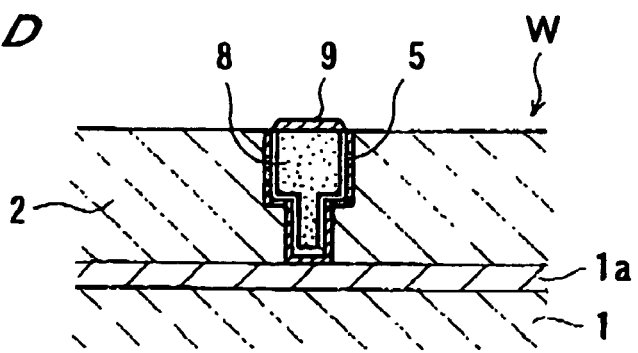

Preferred embodiments of the present invention will now be described with reference to the drawings. The following embodiments illustrate the case of forming a protective film (cap material) 9 of a CoWP alloy selectively on exposed surfaces of interconnects 8 of, for example, copper as a base metal to cover and protect the interconnects (base metal) 8 with the protective film (alloy film) 9, as shown in FIG. 1D. The present invention is, of course, applicable also to the case of forming a metal film (plated film) of a Co alloy, a Ni alloy, etc., for example, on a copper or silver surface to cover the copper or silver surface with the metal film.

Figure 3:
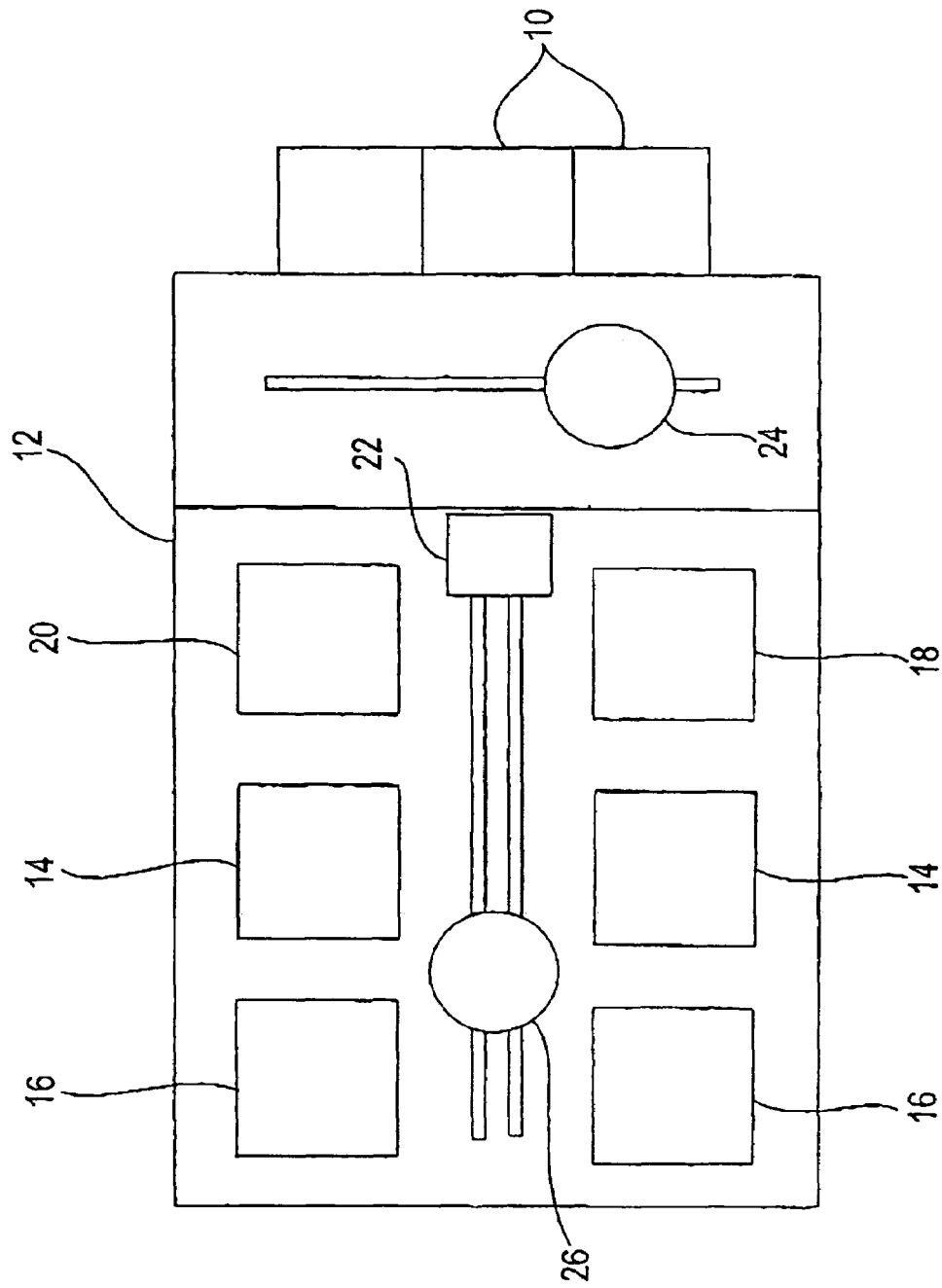
FIG. 3 is a layout plan view of a substrate processing apparatus according to an embodiment of the present invention.

FIG. 3 shows a layout plan view of a substrate processing apparatus according to an embodiment of the present invention. As shown in FIG. 3, the substrate processing apparatus includes a loading/unloading unit 10 housing a substrate cassette that houses substrates W each having interconnects (base metal) 8 of e.g. copper formed in the surface, as shown in FIG. 1C. In a rectangular apparatus frame 12. provided with a ventilation system, there are disposed two integrated units (cleaning and catalyst application units) 14, each integrated unit consisting of a cleaning unit for cleaning (post-CMP cleaning or pre-plating cleaning) of the surface of a substrate W and a catalyst application unit for applying a catalyst, such as Pd, to the surface of the substrate after cleaning.

In the apparatus frame 12 are also disposed two electroless plating units 16 for carrying out electroless plating of the surface (processing surface) of the substrate W, a post-plating processing unit 18 for carrying out post-plating processing of the substrate W to enhance the selectivity of a protective film (alloy film) 9 (see FIG. 1D) which has been formed by electroless plating on the surfaces of interconnects 8, a drying unit 20 for drying the substrate W after the post-processing, and a temporary storage table 22. Further, a first substrate transport robot 24 for transporting the substrate W between the substrate cassette set in the loading/unloading unit 10 and the temporary storage table 22, and a second substrate transport robot 26 for transporting the substrate W between the temporary storage table 22 and the unit 14, 16, 18 or 20 are respectively disposed movably in the apparatus frame 12.

Figure 4:
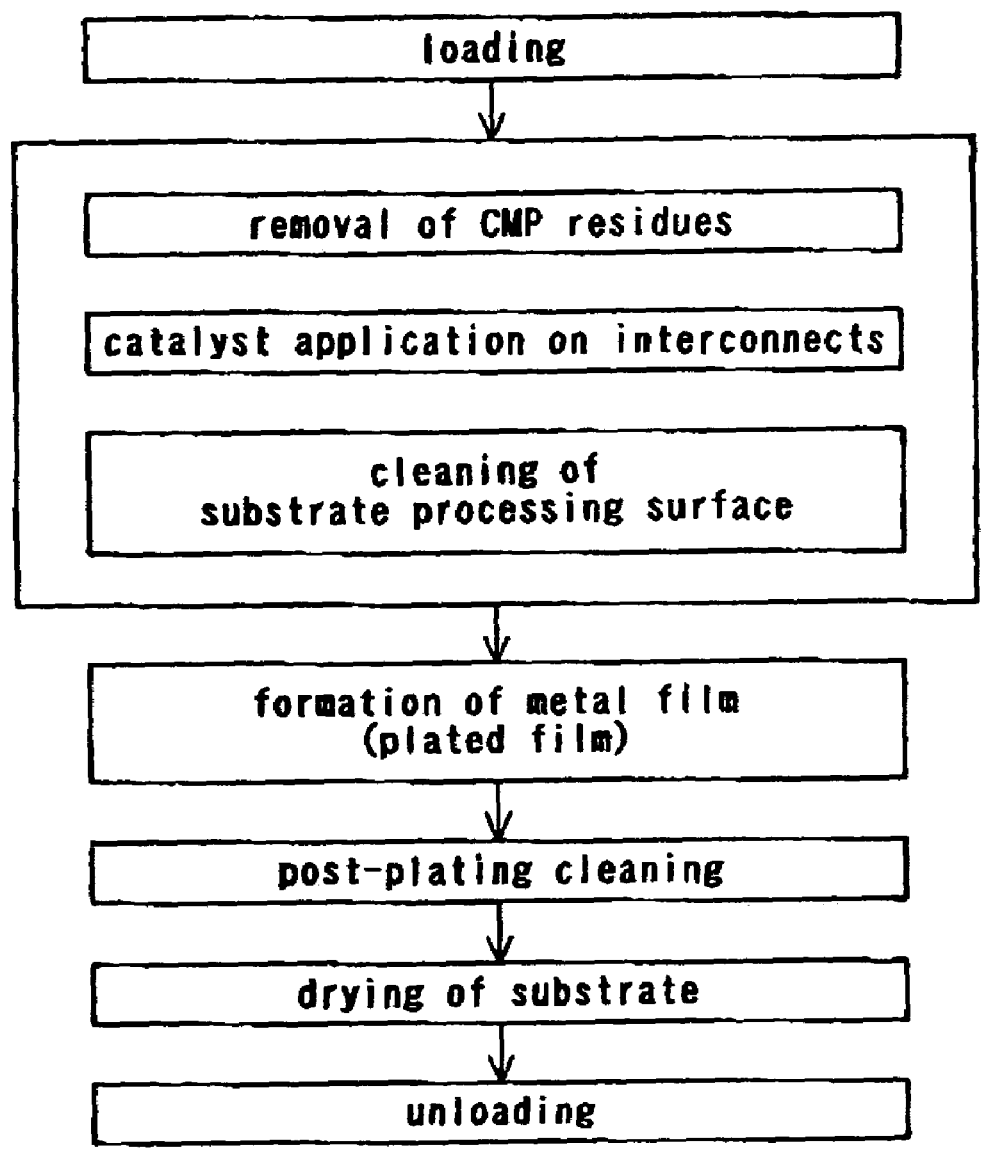
FIG. 4 is a flow chart of a substrate processing method according to an embodiment of the present invention as carried out by the substrate processing apparatus shown in FIG. 3.
Figure 5:
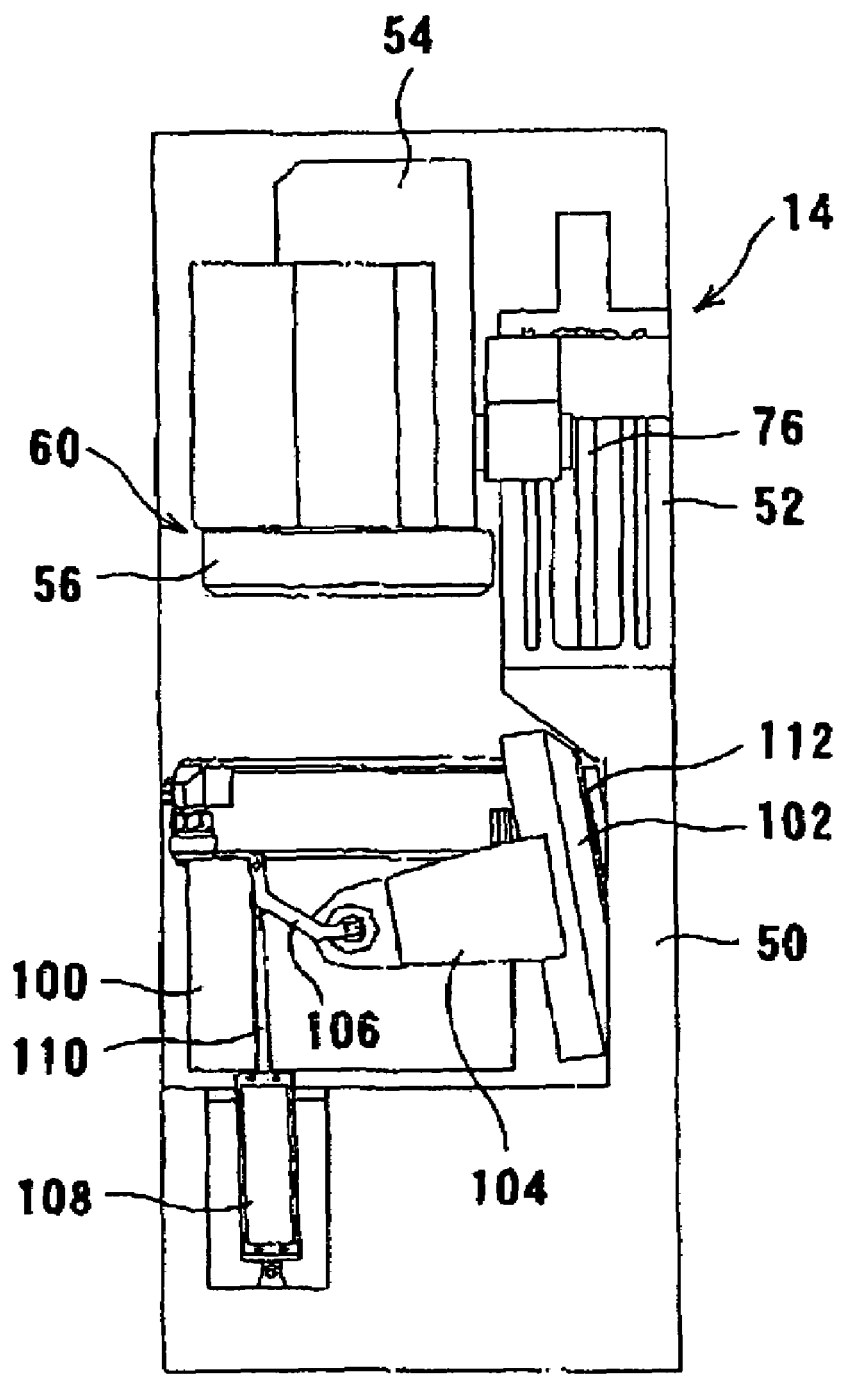
FIG. 5 is a front view of an integrated unit of the substrate processing apparatus shown in FIG. 3 upon transfer of a substrate.

A description will now be given of a series of substrate processings (electroless plating processings) as carried out by this substrate processing apparatus, by referring to FIG. 4.

First, one substrate W is taken by the first substrate transport robot 24 out of the cassette set in the loading/unloading unit 10 and housing substrates W with their front surfaces facing upwardly (face up), each substrate W having been subjected to the formation of interconnects 8 in the surface, followed by drying, as shown in FIG. 1C, and the substrate W is transported to the temporary storage table 22 and placed on it. The substrate W on the temporary storage table 22 is transported by the second substrate transport robot 26 to the integrated unit 14. In the integrated unit 14, the substrate W is held face down, and cleaning of the front surface with a cleaning solution (chemical) is carried out as a pre-plating processing.

An aqueous solution of a carboxyl group-containing organic acid (first chelating agent), to which is added a surfactant and optionally a second chelating agent having a group other than carboxyl group, is used as the cleaning solution.

Examples of the carboxyl group-containing organic acid (first chelating agent) include citric acid, oxalic acid, malic acid, maleic acid, tartaric acid, glutaric acid, adipic acid, pimelic acid, succinic acid, malonic acid, fumaric acid and phthalic acid, and their organic salts.

Examples of the second chelating agent include an amino polycarboxylic acid, phosphonic acid, a condensed phosphoric acid, a diketone, an amine, a halide ion, cyanide ion, thiocyanate ion, thiosulfate ion and ammonium ion.

The second chelating agent may also be a polyaminocarboxylic acid or a methylenephosphonic acid, or an ammonium salt thereof. Examples of the polyaminocarboxylic acid include nitrilotriacetic acid (NTA), diethylenetriamine pentaacetic acid (DTPA), ethylenediamine tetraacetic acid (EDTA), trans-1,2-cyclohexanediamine tetracetic acid (Cy-DTA) and N-(2-hydroxyethyl) ethylenediamine-N, N', N'-triacetic acid(EDTA-OH), and compounds containing any of them. Examples of the methylenephosphonic acid include ethylenediamine tetrakis (methylenephosphonic acid) and compounds containing it.

The surfactant is preferably an ionic long-chain alkyl ester surfactant. The surfactant may also be a nonionic surfactant. Examples of the nonionic surfactant include a sulfuric acid ester, such as $C_9H_{19}PhO$ $(CH_2CH_2O)_4SO_3H$, $C_{12}H_{25}O$ $(CH_2CH_2O)_2SO_3H$ and $C_{12}H_{25}O(CH_2CH_2O)_4SO_3H$, and an ammonium salt thereof, and a primary, secondary or tertiary amine salt of a sulfuric acid ester, such as $C_8H_{17}N(CH_3)_3Br$ or $C_{12}H_{25}N(CH_3)_2Br$.

The cleaning solution is sprayed toward the surface of the substrate W, for example, for one minute to thereby etch away an oxide, etc. on the interconnects 8 and activate the surfaces of interconnects 8 and, at the same time, remove CMP residues remaining on the surface of the substrate W. Thereafter, the cleaning solution remaining on the surface of the substrate W is rinsed (cleaned) off with a rinsing liquid, such as pure water, according to necessity.

Next, while the substrate W is kept held face down in the integrated unit 14, catalyst application processing for applying a catalyst, such as Pd, to the surface of the substrate W is carried out successively. In particular, a processing solution (catalyst processing solution), which is prepared by mixing a solution containing a catalyst metal ion, for example, a solution obtained by dissolving $PdSO_4$ as a catalyst metal supply source in an aqueous solution of an inorganic acid, such as $H_2SO_4$, with the same cleaning solution as used in the above cleaning, is sprayed toward the surface of the substrate W, for example, for one minute to thereby apply Pd as a catalyst to the surfaces of interconnects 8. Thus, Pd seeds as catalyst seeds are formed on the surfaces of interconnects 8, whereby the exposed surfaces of interconnects 8 is activated. Thereafter, the processing solution remaining on the surface of the substrate W is rinsed (cleaned) off with a rinsing liquid, such as pure water.

By thus using, as a processing solution for applying a catalyst to a substrate, a mixture of a solution containing a catalyst metal ion and a cleaning solution containing a carboxyl group-containing organic acid (first chelating agent), a surfactant, and optionally a second chelating agent having a group other than carboxyl group, it becomes possible to form, for example, a Pd complex, having a larger size than Pd ion, which hardly enters, for example, crystal grain boundaries of copper constituting interconnects 8, and interstices, for example, between the interconnects 8 and a barrier layer 5, as shown in FIG. 1C, thereby preventing the copper, etc. from being excessively etched locally especially along the weak copper crystal grain boundaries or along the interfaces between the interconnects 8 and the barrier layer 5. Further, it becomes possible to form a complex with an interconnect material (copper complex), such as copper, upon catalyst application. The complex can adhere to the surfaces of interconnects 8, copper crystal grain boundaries, interstices between the interconnects 8 and the barrier layer 5, etc. The copper complex can thus function as a protective film. This can prevent the formation of voids in the interconnects 8, for example composed of copper, thereby preventing a rise in the resistance of the interconnects.

The inclusion of a carboxyl group-containing organic acid (chelating agent) and a surfactant, besides a catalyst metal ion, in the processing solution can stabilize the processing solution (catalyst processing solution), making it possible to circulate and reuse the processing solution. In particular, the chelating agent can form, for example, a stable Pd complex, as described above, and the surfactant can decrease the surface tension between Pd complexes, thereby lowering the possibility of coalescence of Pd complexes. Thus, Pd complexes can be prevented from coalescing and precipitating as fine particles which can adhere to an insulating film, etc. Further, the surfactant can lower the surface tension of the processing solution whereby a Pd complex, for example, can more easily approach the surfaces of interconnects 8, enabling efficient replacement of copper with Pd on copper interconnects 8.

Besides Pd ion used in this embodiment, Sn ion, Ag ion, Pt ion, Au ion, Cu ion, Co ion or Ni ion can be used as s catalyst metal ion. The use of Pd ion is especially preferred from the viewpoints of reaction rate, easiness of control, etc. Further, besides $H_2SO_4$ used in this embodiment, other inorganic acid, such as HCl, $HNO_3$ or HF, or an organic acid, such as a carboxylic acid or an alkanesulfonic acid, can be used as an aqueous solvent for a catalyst metal ion.

The surface of the substrate W after catalyst application is rinsed (cleaned) off with a rinsing liquid, such as pure water, then is transported by the second transport robot 26 to the electroless plating unit 16, where electroless plating is carried out on to the surface of the substrate W. Specifically, the surface of the substrate W is brought into contact with, for example, a CoWP plating solution at the solution temperature of 80° C. for about 120 seconds to carry out electroless plating (electroless CoWP cap plating) selectively on surfaces of the interconnects 8, to which Pd as a catalyst is applied, so as to selectively form a protective film (cap material) 9. The composition of the plating solution is as follows.

$CoSO_4.7H_2O$: 23 g/L
$Na_3C_6H_5O_7.2H_2O$: 145 g/L
$(NH_4)_2SO_4$: 31 g/L
$NaH_2PO_2.H_2O$: 18 g/L
$Na_2WO_4.2H_2O$: 10 g/L
pH: 8.8 (adjusted by aqueous NaOH)

Then, after the substrate W is pulled up from the plating solution, a stop liquid of a neutral liquid having a pH of 6 to 7.5 is brought into contact with the surface of the substrate W to stop the electroless plating process. Thus, the plating reaction is quickly stopped immediately after the substrate W is pulled up from the plating solution, to thereby prevent plating unevenness from being produced on the plated film. It is desirable that this processing time be, for example, 1 to 5 seconds. The stop liquid may be exemplified by pure water, hydrogen gas-dissolved water or electrolytic cathode water.

Thereafter, a plating solution remaining on the surface of the substrate is rinsed (cleaned) off with a rinsing liquid such as pure water. Thus, a protective film 9 of a CoWP alloy film is formed selectively on surfaces of interconnects 8 to protect the interconnects 8.

Next, the substrate W after the electroless plating is transported by the second substrate transport robot 26 to the post-plating processing unit 18, where the substrate W is subjected to post-plating processing (post-cleaning) in order to enhance the selectivity of the protective film (alloy film) 9 formed on the surface of the substrate W and thereby increase the yield. In particular, while applying a physical force to the surface of the substrate W, for example, by roll scrub cleaning or pencil cleaning, a post-plating processing liquid (chemical solution) is supplied onto the surface of the substrate W to thereby completely remove plating residues, such as fine metal particles, from the interlevel dielectric film 2, thus enhancing the selectivity of plating.

The substrate W after the post-plating process is transported by the second substrate transport robot 26 to the drying unit 20, where the substrate W is rinsed, according to necessity, and then rotated at a high speed to spin-dry the substrate W.

The spin-dried substrate W is placed by the second substrate transport robot 26 on the temporary storage table 22, and the substrate W placed on the temporary storage table 22 is returned by the first substrate transport robot 24 to the substrate cassette mounted in the loading/unloading unit 10.

This embodiment illustrates the case of using copper (Cu) as an interconnect material and forming the protecting film 9 of CoWP alloy selectively on the surfaces of interconnects 8 composed of copper. It is also possible to use a Cu alloy, Ag or an Ag alloy as an interconnect material. Further, it is also possible to use as the protective film 9 a film of CoWB, CoP, CoB or other Co alloy, NiWP, NiWB, NiP, NiB or other Ni alloy.

Next, there will be described below the details of various units provided in the substrate processing apparatus shown in FIG. 4.

The integrated unit (cleaning and catalyst application unit) 14 employs a two-liquid separation system to prevent the different liquids from being mixed with each other. While a peripheral portion of a lower surface of the substrate W, which is a surface to be processed (front face), transported in a face-down manner is sealed, the substrate W is fixed by pressing a back surface of the substrate.

As shown in FIGS. 5 through 8, the integrated unit 14 includes a fixed frame 52 that is mounted on the upper part of a frame 50, and a movable frame 54 that moves up and down relative to the fixed frame 52. A processing head 60, which includes a bottomed cylindrical housing portion 56, opening downwardly and a substrate holder 58, is suspended from and supported by the movable frame 54. In particular, a head-rotating servomotor 62 is mounted to the movable frame 54, and the housing portion 56 of the processing head 60 is coupled to the lower end of the downward-extending output shaft (hollow shaft) 64 of the servomotor 62.

Figure 8:
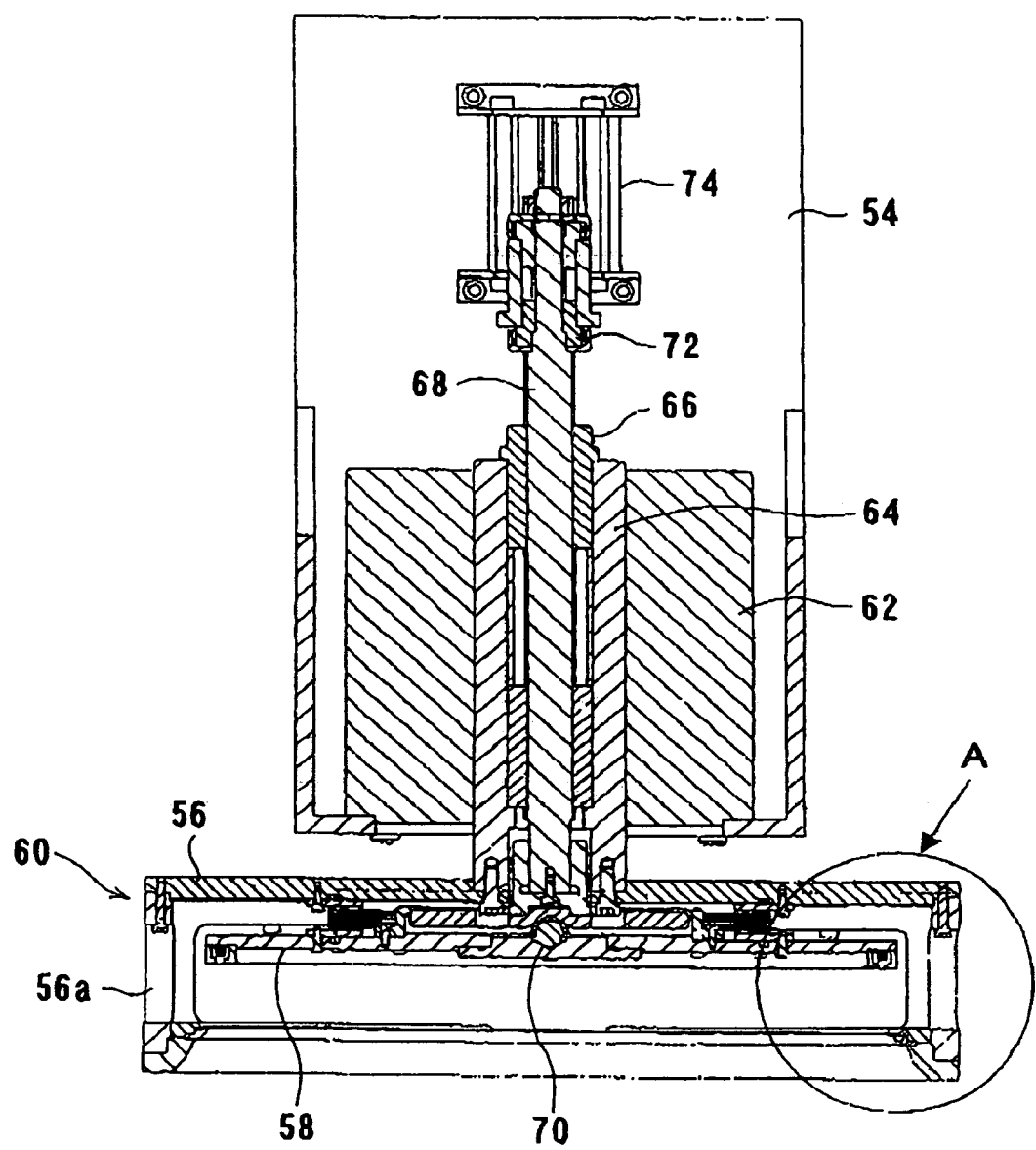
FIG. 8 is a cross-sectional view of a processing head of the integrated unit of the substrate processing apparatus shown in FIG. 3 upon transfer of a substrate.

As shown in FIG. 8, a vertical shaft 68, which rotates together with the output shaft 64 via a spline 66, is inserted in the output shaft 64, and the substrate holder 58 of the processing head 60 is coupled to the lower end of the vertical shaft 68 via a ball joint 70. The substrate holder 58 is positioned within the housing portion 56. The upper end of the vertical shaft 68 is coupled via a bearing 72 and a bracket to a fixed ring-lifting cylinder 74 secured to the movable frame 54. Thus, by the actuation of the cylinder 74, the vertical shaft 68 moves vertically independently of the output shaft 64.

Linear guides 76, which extend vertically and guide vertical movement of the movable frame 54, are mounted to the fixed frame 52, so that, by the actuation of a head-lifting cylinder (not shown), the movable frame 54 moves vertically by the guide of the linear guides 76.

Figure 10:
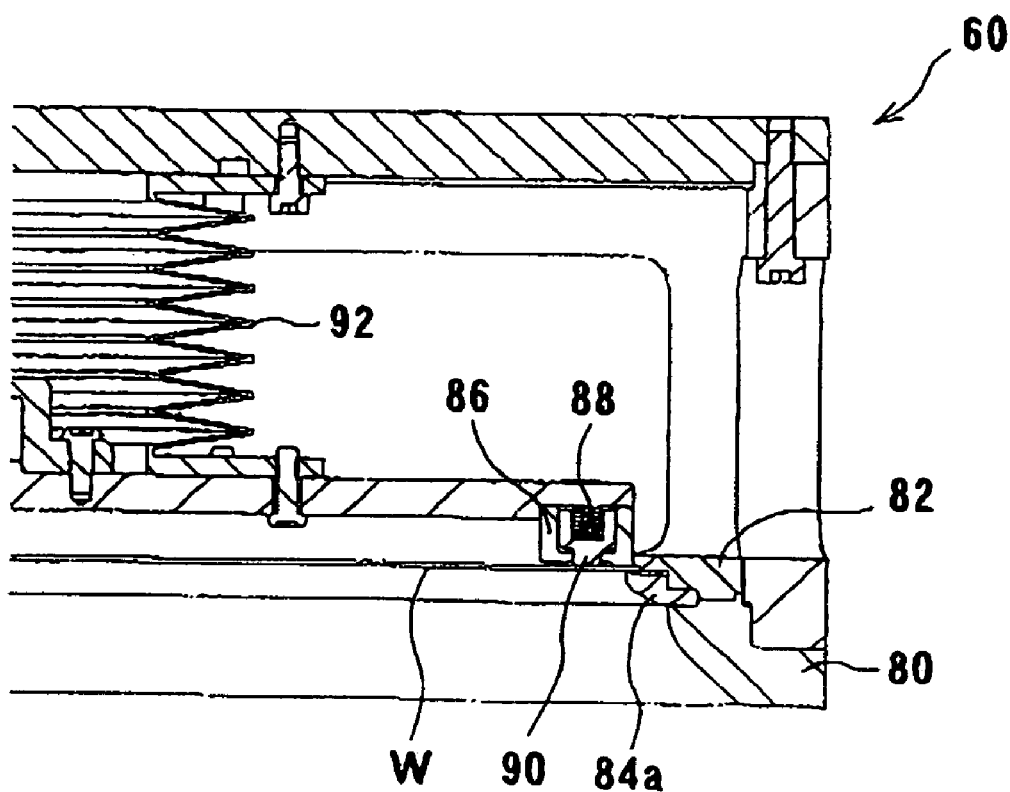
FIG. 10 is a view corresponding to FIG. 9, showing the processing head of the integrated unit of the substrate processing apparatus shown in FIG. 3 upon fixing of a substrate.

Substrate insertion windows 56a for inserting the substrate W into the housing portion 56 are formed in the circumferential wall of the housing portion 56 of the processing head 60. Further, as shown in FIGS. 9 and 10, a seal ring 84a is provided in the lower portion of the housing portion 56 of the processing head 60, an outer peripheral portion of the seal ring 84a being sandwiched between a main frame 80 made of e.g. PEEK and a guide frame 82. The seal ring 84a is provided to make contact with a peripheral portion of the lower surface of the substrate W to seal the peripheral portion.

On the other hand, a substrate fixing ring 86 is fixed to a peripheral portion of the lower surface of the substrate holder 58. Columnar pushers 90 each protrudes downwardly from the lower surface of the substrate fixing ring 86 by the elastic force of a spring 88 disposed within the substrate fixing ring 86 of the substrate holder 58. Further, a flexible cylindrical bellows-like plate 92 made of e.g. Teflon (registered trademark) is disposed between the upper surface of the substrate holder 58 and the upper wall of the housing portion 56 to hermetically seal therein.

When the substrate holder 58 is in a raised position, a substrate W is inserted from the substrate insertion window 56a into the housing portion 56. The substrate W is then guided by a tapered surface 82a provided in the inner circumferential surface of the guide frame 82, and positioned and placed at a predetermined position on the upper surface of the seal ring 84a. In this state, the substrate holder 58 is lowered so as to bring the pushers 90 of the substrate fixing ring 86 into contact with the upper surface of the substrate W. The substrate holder 58 is further lowered so as to press the substrate W downwardly by the elastic forces of the springs 88, thereby forcing the seal ring 84a to make pressure contact with a peripheral portion of the front surface (lower surface) of the substrate W to seal the peripheral portion while nipping the substrate W between the housing portion 56 and the substrate holder 58 to hold the substrate W.

When the head-rotating servomotor 62 is driven while the substrate W is thus held by the substrate holder 58, the output shaft 64 and the vertical shaft 68 inserted in the output shaft 64 rotate together via the spline 66, whereby the substrate holder 58 rotates together with the housing portion 56.

At a position below the processing head 60, there is provided an upward-open processing tank 100 comprising an outer tank 100a and an inner tank 100b (see FIG. 11) that have a slightly larger inner diameter than the outer diameter of the processing head 60. A pair of leg portions 104, each of which is mounted to a lid 102, is rotatably supported on the outer circumferential portion of the inner tank 100b of the processing tank 100. Further, a crank 106 is integrally coupled to each leg portion 106, and the free end of the crank 106 is rotatably coupled to the rod 110 of a lid-moving cylinder 108. Thus, by the actuation of the lid-moving cylinder 108, the lid 102 moves between a processing position at which the lid 102 covers the top opening of the inner tank 100b of the processing tank 100 and a retreat position beside the inner tank 100b. In the surface (upper surface) of the lid 102, there is provided a nozzle plate 112 having a large number of spray nozzles 112a for spraying outwardly (upwardly), for example, pure water.

Figure 11:
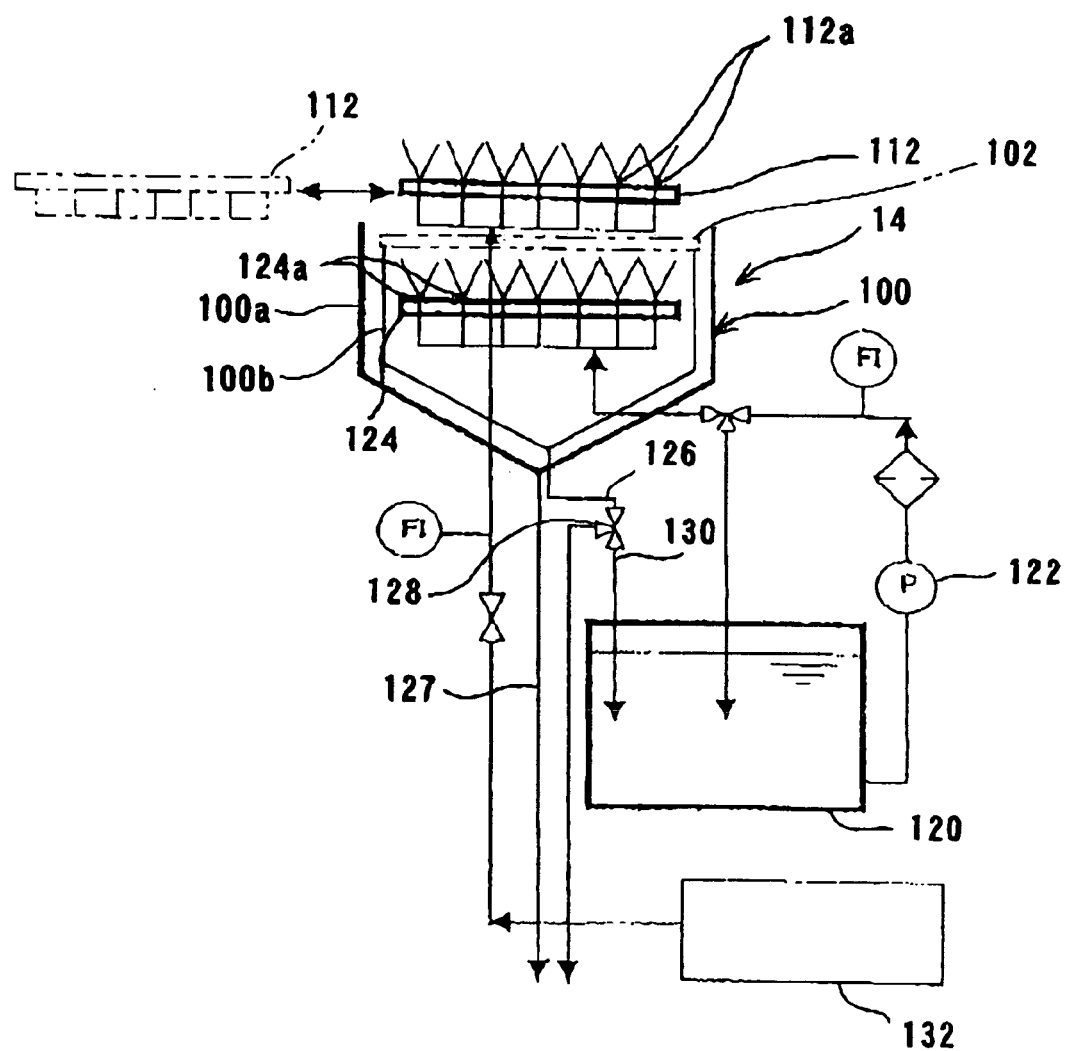
FIG. 11 is a system diagram of a substrate processing apparatus shown in FIG. 3.

Further, as shown in FIG. 11, a nozzle plate 124 having a plurality of spray nozzles 124a for spraying upwardly a chemical solution, i.e., a cleaning solution or a processing solution (catalyst application solution), supplied from a chemical solution tank 120 by driving the chemical solution pump 122 is provided in the inner tank 100b of the processing tank 100 in such a manner that the spray nozzles 124a are equally distributed over the entire surface of the cross section of the inner tank 100b. A drainpipe 126 for draining a chemical solution (waste liquid) to the out side is connected to the bottom of the inner tank 100b. A three-way valve 128 is provided in the drainpipe 126, and the chemical solution (waste liquid) is returned to the chemical solution tank 120 through a return pipe 130 connected to one of ports of the three-way valve 128 to recycle the chemical solution, as needed.

Though only one chemical solution tank 120 is shown diagrammatically, two chemical solution tanks, viz. a first chemical solution tank for holding the above-described cleaning solution and a second chemical solution tank for holding the above-described processing solution (catalyst processing solution), are actually provided, and the cleaning solution or the processing solution is selectively supplied from one of the first and second chemical processing tanks to the spray nozzles 124a and sprayed therefrom.

Further, according to this embodiment, the nozzle plate 112 provided on the surface (upper surface) of the lid 102 is connected to a rinsing liquid supply source 132 for supplying a rinsing liquid, such as pure water. Further, a drainpipe 127 is connected also to the bottom of the outer tank 100a.

Accordingly, the processing head 60 holding a substrate W is lowered to thereby close the top opening of the outer tank 100a of the processing tank 100 with the processing head 60, and a chemical solution, which is either the cleaning solution in the case of the above-described cleaning or the processing solution (catalyst processing solution) in the case of the catalyst application processing, is sprayed toward the substrate W, whereby the chemical solution can be supplied uniformly onto the entire lower surface (processing surface) of the substrate W. Further, the chemical solution can be discharged from the drainpipe 126 while preventing the chemical solution from scattering out of the processing tank 100.

According to this embodiment, by using the cleaning solution for use in the cleaning processing as one of the main components of the processing solution for use in the catalyst application processing, it becomes possible to carry out the cleaning processing and the catalyst application processing in the one integrated unit 14 without a fear of cross-contamination.

Figure 7:
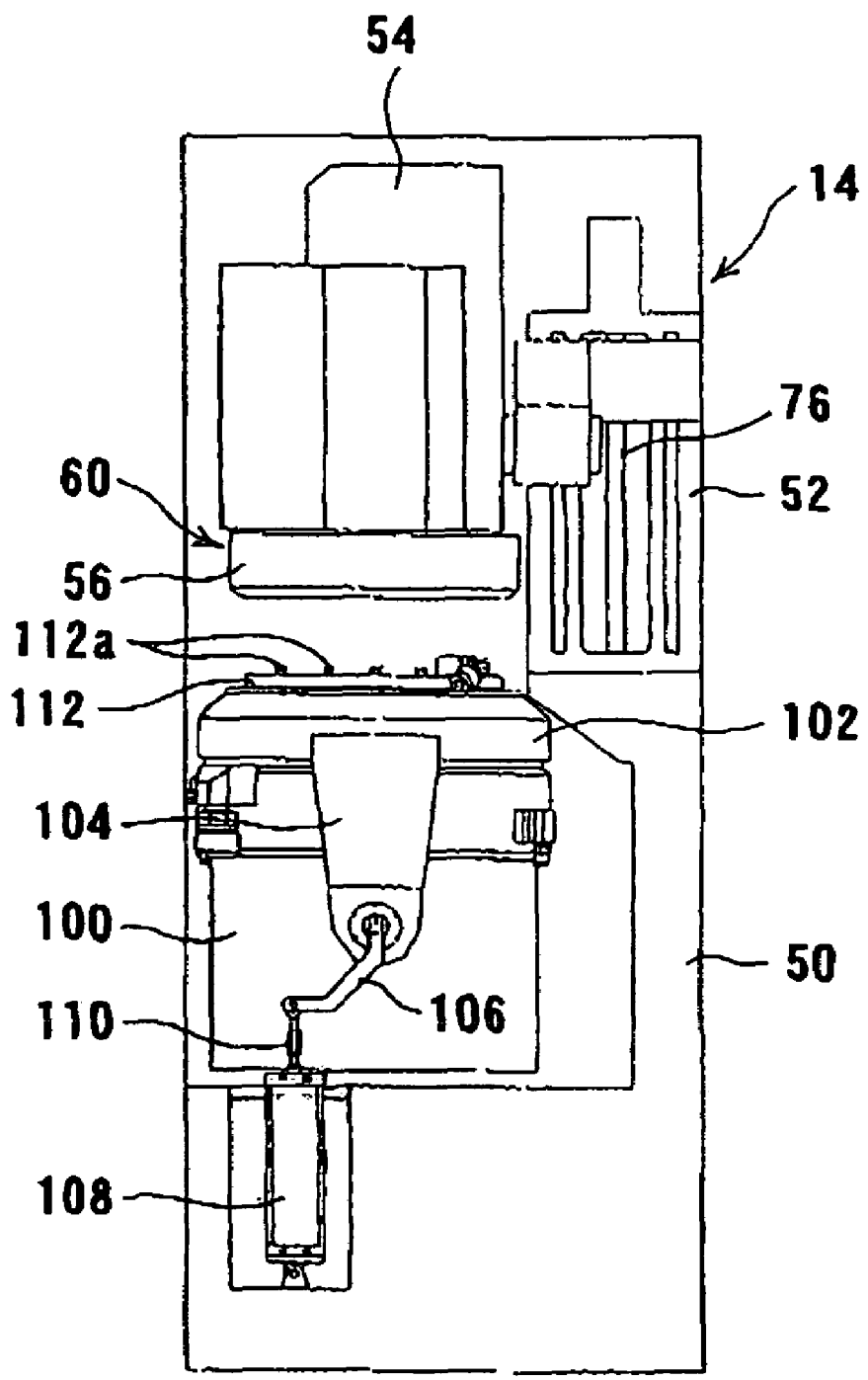
FIG. 7 is a front view of the integrated unit of the substrate processing apparatus shown in FIG. 3 upon rinsing.

Further, by raising the processing head 60 and closing the top opening of the inner tank 100b of the processing tank 100 with the lid 102, and then spraying a rinsing liquid from the spray nozzles 112a of the nozzle plate 112 disposed on the upper surface of the lid 102 toward the substrate W held in the processing head 60, the rinsing processing (cleaning processing) is carried out to remove the chemical solution from the surface of the substrate W. Because the rinsing liquid passes through the clearance between the outer tank 100a and the inner tank 100b and is discharged through the drainpipe 127, the rinsing liquid is prevented from flowing into the inner tank 100b and from being mixed with the chemical solution, i.e., a cleaning solution or a processing solution (catalyst processing solution), sprayed from the spray nozzles 124a of the nozzle plate 124 disposed in the inner tank 100b of the processing tank 100 toward the substrate W, thereby spraying the chemical solution uniformly onto the entire surface of the substrate W. The processing head 60 is raised and stopped at a predetermined position and, as shown in FIG. 7, the lid 102 in the retreat position is moved to the position at which it covers the top opening of the inner tank 100b of the processing tank 100. A rinsing liquid is then sprayed from the spray nozzles 112a of the nozzle plate 112 disposed on the upper surface of the lid 102 toward the rotating substrate W held in the processing head 60. The chemical processing by the chemical solution and the rinsing processing by the rinsing liquid of the substrate W can thus be carried out successively while avoiding mixing of the two liquids.

FIGS. 12 through 18 show an electroless plating unit 16. This electroless plating unit 16 includes a plating tank 200 (see FIG. 18) and a substrate head 204, disposed above the plating tank 200, for detachably holding a substrate W.

As shown in detail in FIG. 12, the processing head 204 has a housing portion 230 and a head portion 232. The head portion 232 mainly comprises a suction head 234 and a substrate receiver 236 for surrounding the suction head 234. The housing portion 230 accommodates therein a substrate rotating motor 238 and substrate receiver drive cylinders 240. The substrate rotating motor 238 has an output shaft (hollow shaft) 242 having an upper end coupled to a rotary joint 244 and a lower end coupled to the suction head 234 of the head portion 232. The substrate receiver drive cylinders 240 have respective rods coupled to the substrate receiver 236 of the head portion 232. Stoppers 246 are provided in the housing portion 230 for mechanically limiting upward movement of the substrate receiver 236.

The suction head 234 and the substrate receiver 236 are operatively connected to each other by a splined structure such that when the substrate receiver drive cylinders 240 are actuated, the substrate receiver 236 vertically moves relative to the suction head 234, and when the substrate rotating motor 238 is driven, the output shaft 242 thereof is rotated to rotate the suction head 234 with the substrate receiver 236.

Figure 13:
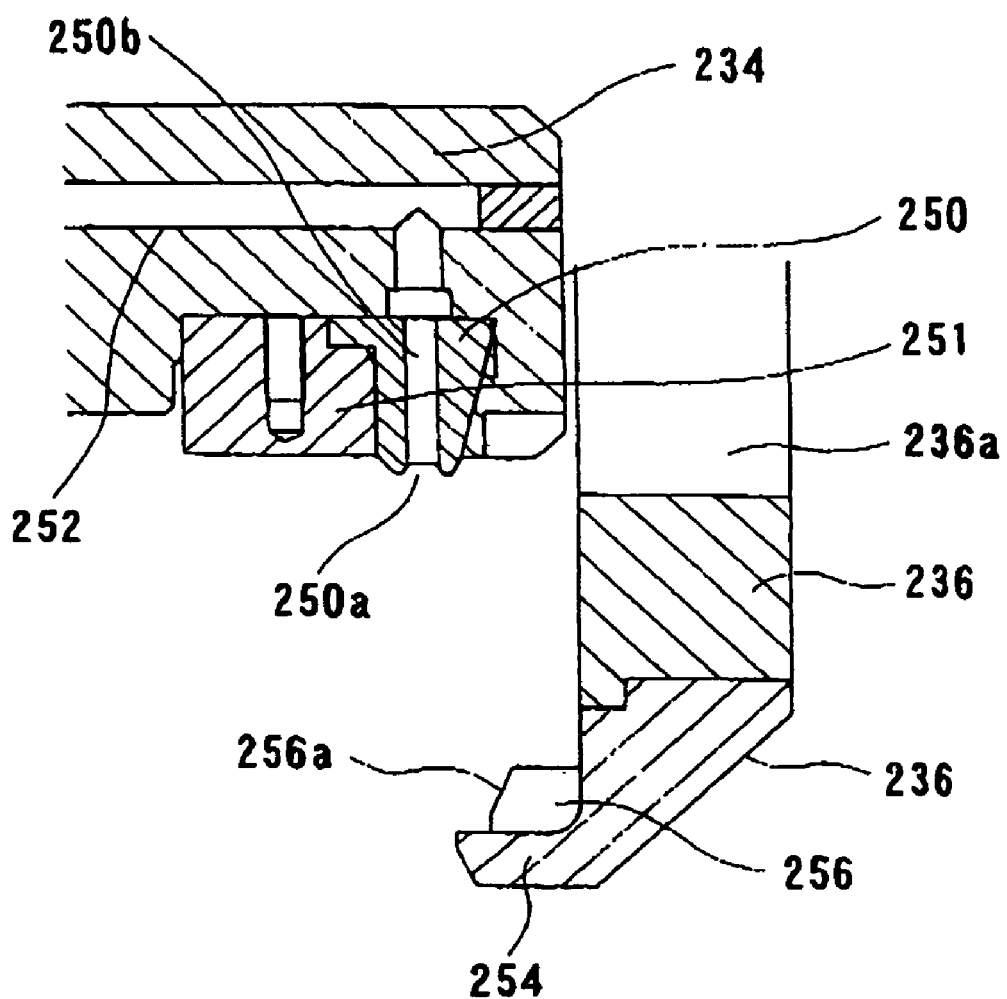
FIG. 13 is an enlarged view of the portion B of FIG. 12.
Figure 14:
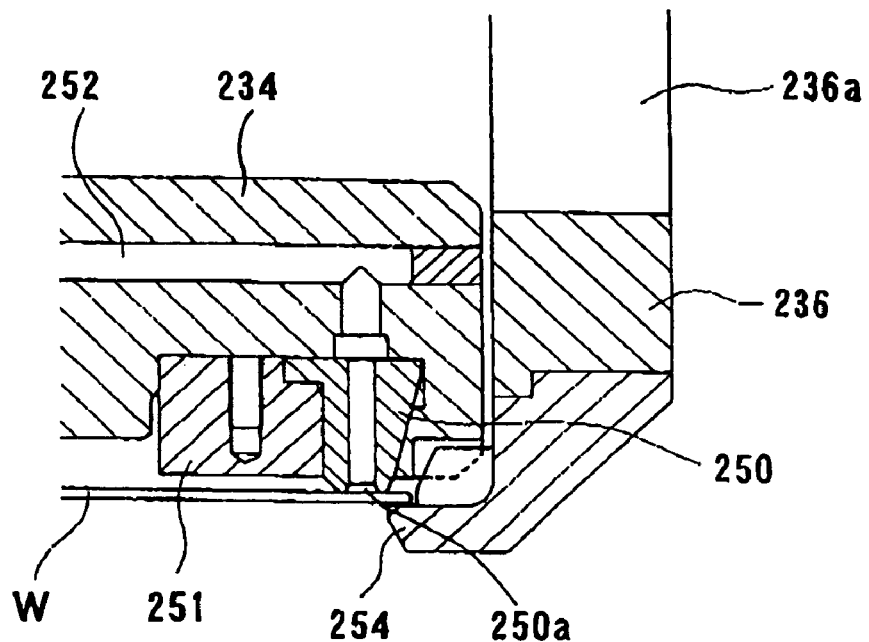
FIG. 14 is a view corresponding to FIG. 13, showing the substrate head of the electroless plating unit of the substrate processing apparatus shown in FIG. 3 upon fixing of a substrate.
Figure 15:
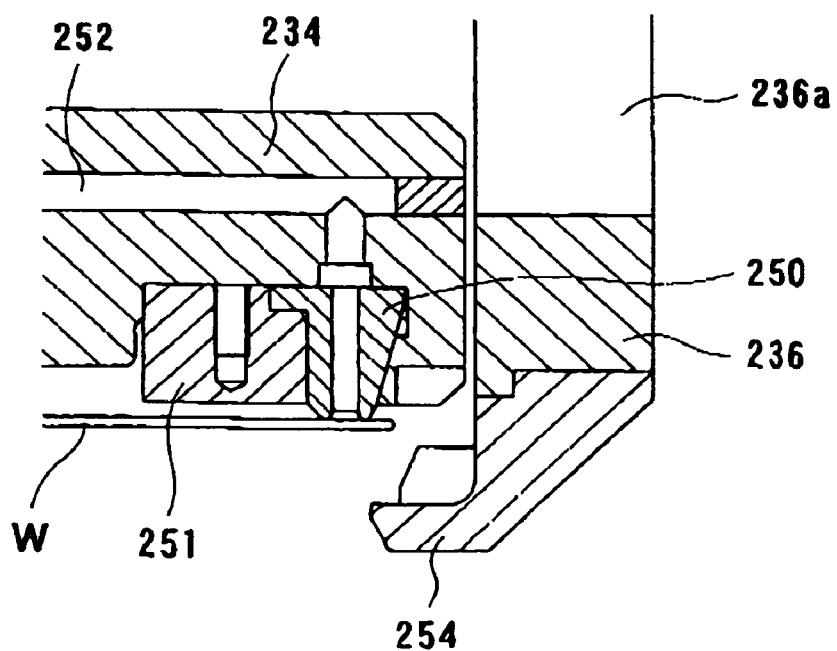
FIG. 15 is a view corresponding to FIG. 13, showing the substrate head of the electroless plating unit of the substrate processing apparatus shown in FIG. 3 upon plating.

As shown in detail in FIGS. 13 through 15, a suction ring 250, for attracting and holding a substrate W against its lower surface to be sealed, is mounted on a lower circumferential edge of the suction head 234 by a presser ring 251. The suction ring 250 has a recess 250a continuously defined in a lower surface thereof in a circumferential direction and in communication with a vacuum line 252 extending through the suction head 234 by a communication hole 250b that is defined in the suction ring 250. When the recess 250a is evacuated, the substrate W is attracted to and held by the suction ring 250. Because the substrate W is attracted under vacuum to the suction ring 250 along a radially narrow circumferential area provided by the recess 250a, any adverse effects such as a deflection caused by the vacuum on the substrate W are minimized. When the suction ring 250 is dipped in the plating solution (processing solution), not only the surface (lower surface) of the substrate W, but also its circumferential edge, can be dipped in the plating solution. The substrate W is released from the suction ring 250 by introducing $N_2$ into the vacuum line 252.

The substrate receiver 236 is in the form of a downwardly open, hollow bottomed cylinder having substrate insertion windows 236a defined in a circumferential wall thereof for inserting therethrough the substrate W into the substrate receiver 236. The substrate receiver 236 also has an annular ledge 254 projecting inwardly from its lower end, and annular protrusions 256 disposed on an upper surface of the annular ledge 254 and each having a tapered inner circumferential surface 256a for guiding the substrate W.

As shown in FIG. 13, when the substrate receiver 236 is lowered, the substrate W is inserted through the substrate insertion window 236a into the substrate receiver 236. The substrate W thus inserted is guided by the tapered surfaces 256a of the protrusions 256 and positioned thereby onto the upper surface of the ledge 254 in a predetermined position thereon. The substrate receiver 236 is then elevated until it brings the upper surface of the substrate W placed on the ledge 254 into abutment against the suction ring 250 of the suction head 234, as shown in FIG. 14. Then, the recess 250a in the vacuum ring 250 is evacuated through the vacuum line 252 to attract the substrate W while sealing the upper peripheral edge surface of the substrate W against the lower surface of the suction ring 250. When plating is performed, as shown in FIG. 15, the substrate receiver 236 is lowered several mm to space the substrate W from the ledge 254, keeping the substrate W attracted only by the suction ring 250. The substrate W now has its lower peripheral edge surface prevented from not being plated because it is held out of contact with the ledge 254.

Figure 16:
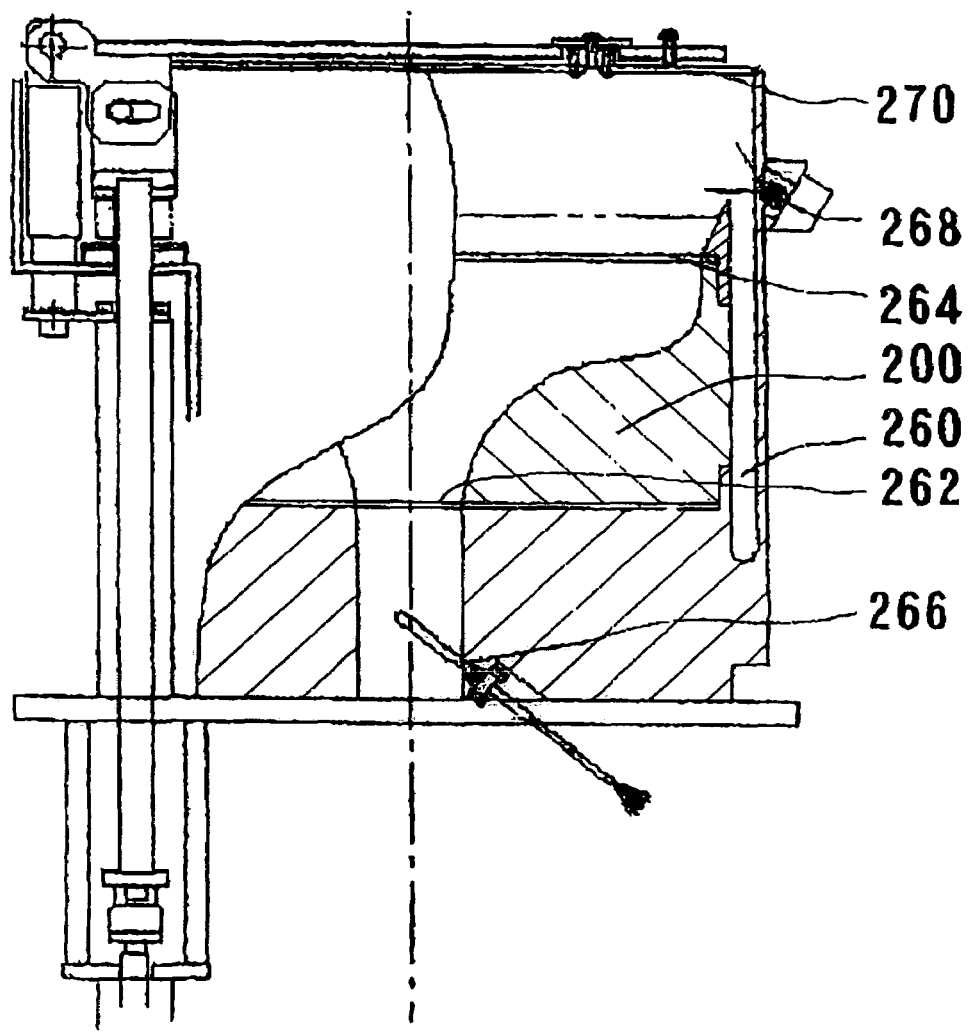
FIG. 16 is a front view, partially broken away, of a plating tank of the electroless plating unit of the substrate processing apparatus shown in FIG. 3, showing the plating tank as the plating tank cover is closed.

FIG. 16 shows the details of the plating tank 200. The plating tank 200 is connected at the bottom to a plating solution supply pipe 308 (see FIG. 18), and is provided in the peripheral wall with a plating solution recovery groove 260. In the plating tank 200, there are disposed two current plates 262, 264 for stabilizing the flow of a plating solution flowing upward. A thermometer 266 for measuring the temperature of the plating solution introduced into the plating tank 200 is disposed at the bottom of the plating tank 200. Further, on the outer surface of the peripheral wall of the plating tank 200 and at a position slightly higher than the liquid level of the plating solution held in the plating tank 200, there is provided a spray nozzle 268 for spraying a stop liquid which is a neutral liquid having a pH of 6 to 7.5, for example, pure water, inwardly and slightly upwardly in the normal direction. After plating, the substrate W held in the head portion 232 is raised and stopped at a position slightly above the surface of the plating solution. In this state, pure water (stop liquid) is immediately sprayed from the spray nozzle 268 toward the substrate W to cool the substrate W, thereby preventing progress of plating by the plating solution remaining on the substrate W.

Further, at the top opening of the plating tank 200, there is provided a plating tank cover 270 capable of opening and closing for closing the top opening of the plating tank 200 in a non-plating time, such as idling time, so as to prevent unnecessary evaporation of the plating solution from the plating tank 200.

Figure 18:
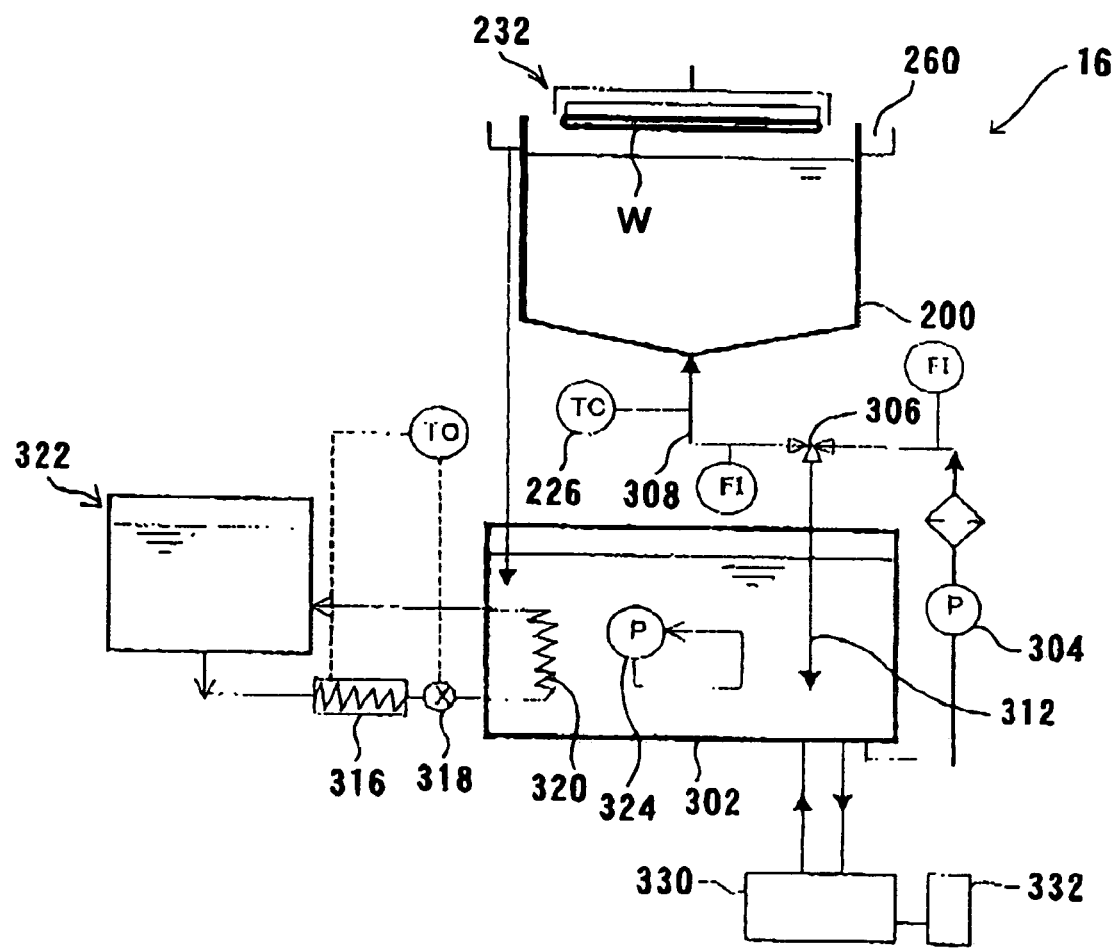
FIG. 18 is a system diagram of the substrate processing apparatus shown in FIG. 3.

As shown in FIG. 18, a plating solution supply pipe 308 extending from a plating solution storage tank 302 and having a plating solution supply pump 304 and a three-way valve 306 is connected to the plating tank 200 at the bottom of the plating tank 200. With this arrangement, during a plating process, a plating solution is supplied into the plating tank 200 from the bottom of the plating tank 200, and the overflowing plating solution is recovered by the plating solution storage tank 302 through the plating solution recovery groove 260. Thus, the plating solution can be circulated. A plating solution return pipe 312 for returning the plating solution to the plating solution storage tank 302 is connected to one of the ports of the three-way valve 306. Thus, the plating solution can be circulated even in a standby condition of plating, and a plating solution circulating system is constructed. The plating solution in the plating solution storage tank 302 is always circulated through the plating solution circulating system, and hence a lowering rate of the concentration of the plating solution can be reduced and the number of the substrates W. which can be processed, can be increased, compared with the case in which the plating solution is simply stored.

The thermometer 266 provided in the vicinity of the bottom of the plating tank 200 measures a temperature of the plating solution introduced into the plating tank 200, and controls a heater 316 and a flow meter 318 described below.

Specifically, in this embodiment, there are provided a heating device 322 for heating the plating solution indirectly by a heat exchanger 320 which is provided in the plating solution in the plating solution storage tank 302 and uses water as a heating medium which has been heated by a separate heater 316 and has passed through the flow meter 318, and a stirring pump 324 for mixing the plating solution by circulating the plating solution in the plating solution storage tank 302. This is because in the plating, in some cases, the plating solution is used at a high temperature (about 80° C.), and the structure should cope with such cases. This method can prevent very delicate plating solution from being mixed with foreign matter or the like, as compared to an in-line heating method.

Figure 17:
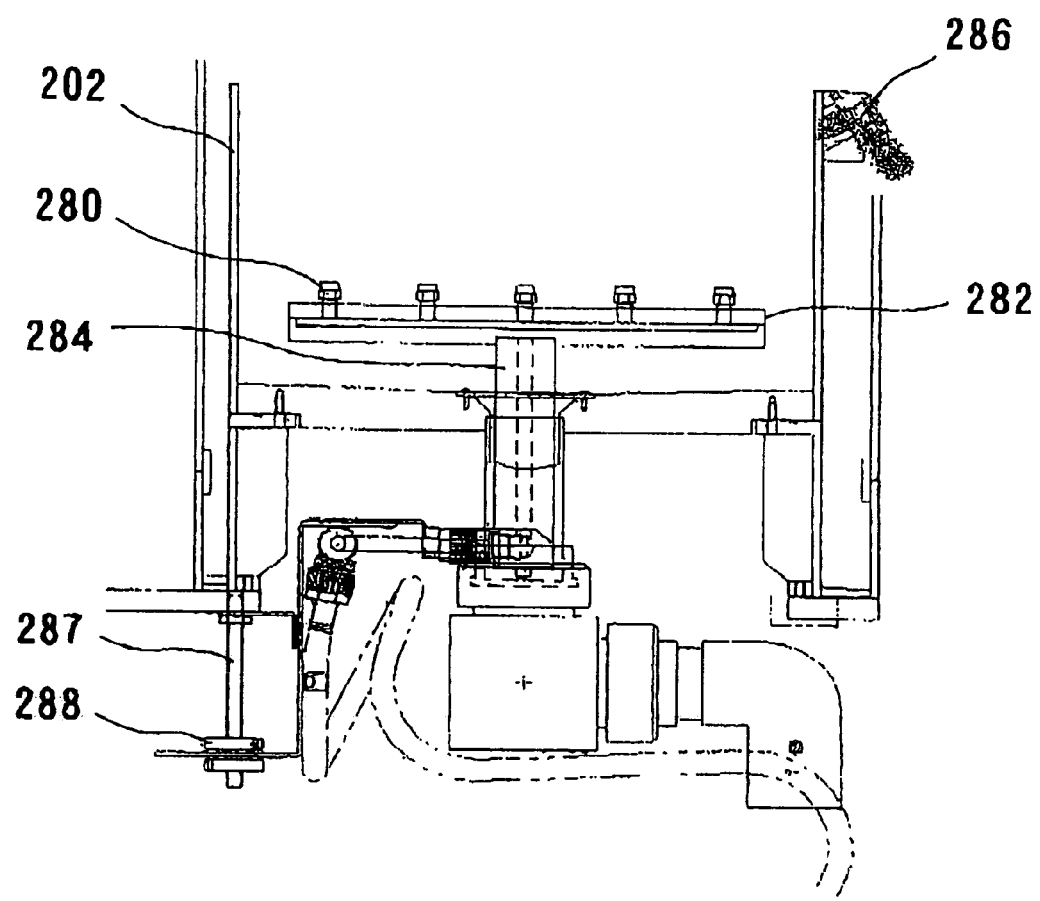
FIG. 17 is a cross-sectional view of a cleaning tank of the electroless plating unit of the substrate processing apparatus shown in FIG. 3.

FIG. 17 shows the details of a cleaning tank 202 provided beside the plating tank 200. At the bottom of the cleaning tank 202, there is provided a nozzle plate 282 having a plurality of spray nozzles 280, attached thereto, for upwardly spraying a rinsing liquid such as pure water. The nozzle plate 282 is coupled to an upper end of a nozzle lifting shaft 284. The nozzle lifting shaft 284 can be moved vertically by changing the position of engagement between a nozzle position adjustment screw 287 and a nut 288 engaging the screw 287 so as to optimize the distance between the spray nozzles 280 and a substrate W located above the spray nozzles 280.

Further, on the outer surface of the peripheral wall of the cleaning tank 202 and at a position above the spray nozzles 280, there is provided a head cleaning nozzle 286 for spraying a cleaning liquid, such as pure water, inwardly and slightly downwardly onto at least a portion, which was in contact with the plating solution, of the head portion 232 of the substrate head 204.

In operating the cleaning tank 202, the substrate W held in the head portion 232 of the substrate head 204 is located at a predetermined position in the cleaning tank 202. A cleaning liquid (rinsing liquid), such as pure water, is sprayed from the spray nozzles 280 to clean (rinse) the substrate W, and at the same time, a cleaning liquid such as pure water is sprayed from the head cleaning nozzle 286 to clean at least a portion, which was in contact with the plating solution, of the head portion 232 of the substrate head 204, thereby preventing a deposit from accumulating on that portion which was immersed in the plating solution.

According to this electroless plating unit 16, when the substrate head 204 is in a raised position, the substrate W is held by vacuum attraction in the head portion 232 of the substrate head 204, as described above, while the plating solution in the plating tank 200 is allowed to circulate.

When plating is performed, the plating tank cover 270 of the plating tank 200 is opened, and the substrate head 204 is lowered, while the substrate head 204 is rotating, so that the substrate W held in the head portion 232 is immersed in the plating solution in the plating tank 200.

After immersing the substrate W in the plating solution for a predetermined time, the substrate head 204 is raised to pull the substrate W from the plating solution in the plating tank 200 and, as needed, pure water (stop liquid) is immediately sprayed from the spray nozzle 268 toward the substrate W to cool the substrate W, as described above. The substrate head 204 is further raised to lift the substrate W to a position above the plating tank 200, and the rotation of the substrate head 204 is stopped.

Next, while the substrate W is held by vacuum attraction in the head portion 232 of the substrate head 204, the substrate head 204 is moved to a position right above the cleaning tank 202. While rotating the substrate head 204, the substrate head 204 is lowered to a predetermined position in the cleaning tank 202. A cleaning liquid (rinsing liquid), such as pure water, is sprayed from the spray nozzles 280 to clean (rinse) the substrate W, and at the same time, a cleaning liquid such as pure water is sprayed from the head cleaning nozzle 286 to clean at least a portion, which was in contact with the plating solution, of the head portion 232 of the substrate head 204.

After completion of cleaning of the substrate W, the rotation of the substrate head 204 is stopped, and the substrate head 204 is raised to lift the substrate W to a position above the cleaning tank 202. Further, the substrate head 204 is moved to the transfer position between the second substrate transport robot 26 and the substrate head 204, and the substrate W is transported to the second transport robot 26, and is transported to a next process.

Figure 19:
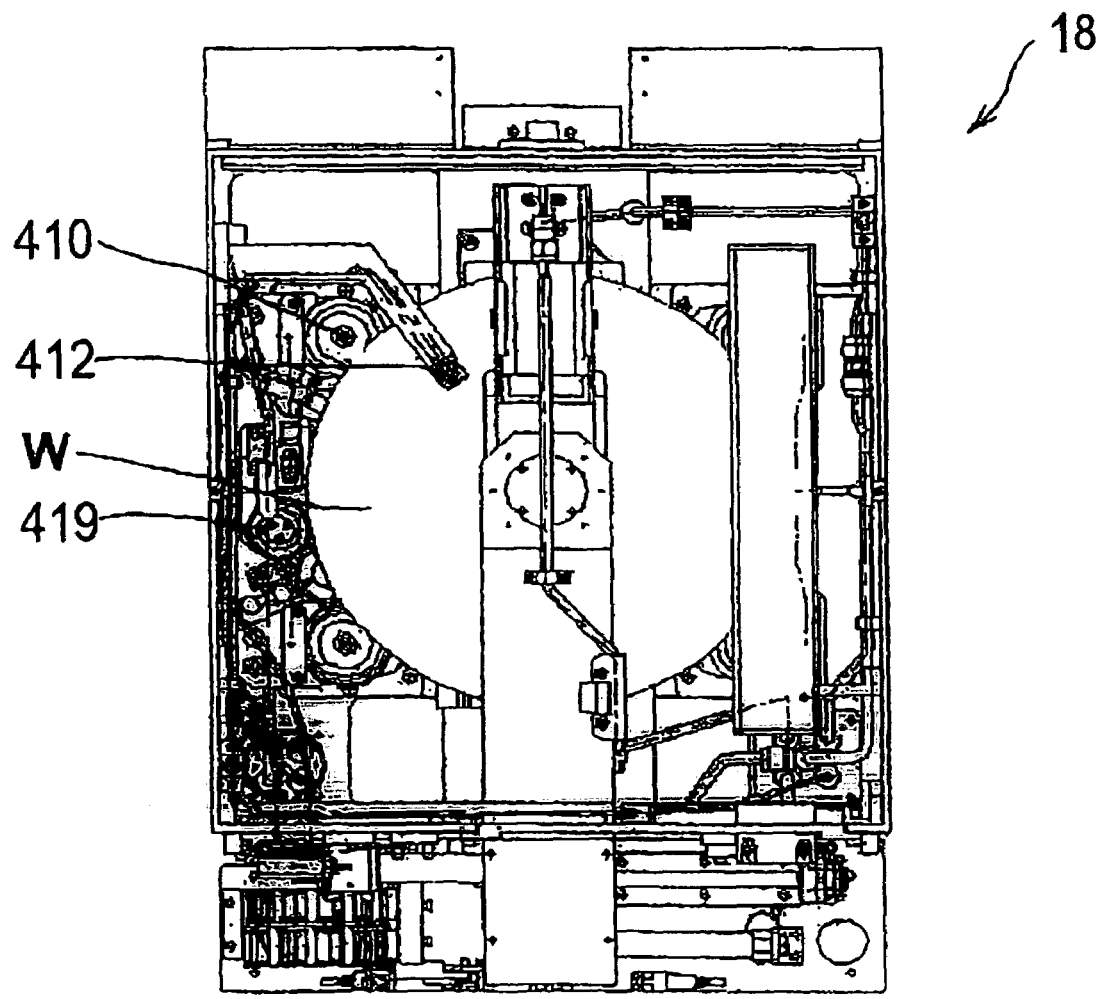
FIG. 19 is a plan view of a post-processing unit of the substrate processing apparatus shown in FIG. 3.

FIG. 19 shows the post-plating processing unit 18. The post-plating processing unit 18 is a unit for forcibly removing particles and unnecessary matters on the substrate W with a roll-shaped brush, and includes a plurality of rollers 410 for holding the substrate W by nipping its peripheral portion, a chemical nozzle 412 for supplying a processing solution (two lines) to the front surface of the substrate W held by the rollers 410, and a pure water nozzle (not shown) for supplying pure water (one line) to the back surface of the substrate W.

In operation, the substrate W is held by the rollers 410 and a roller drive motor is driven to rotate the rollers 410 and thereby rotate the substrate W, while predetermined processing liquids are supplied from the chemical nozzle 412 and the pure water nozzle to the front and back surfaces of the substrate W and the substrate W is nipped between not-shown upper and lower roll sponges (roll-shaped brushes) at an appropriate pressure, thereby cleaning the substrate W. It is also possible to rotate the roll sponges independently so as to increase the cleaning effect.

The post-plating processing unit 18 also includes a sponge (PFR) 419 that rotates while contacting the edge (peripheral portion) of the substrate W, thereby scrub-cleaning the edge of the substrate W.

Figure 20:
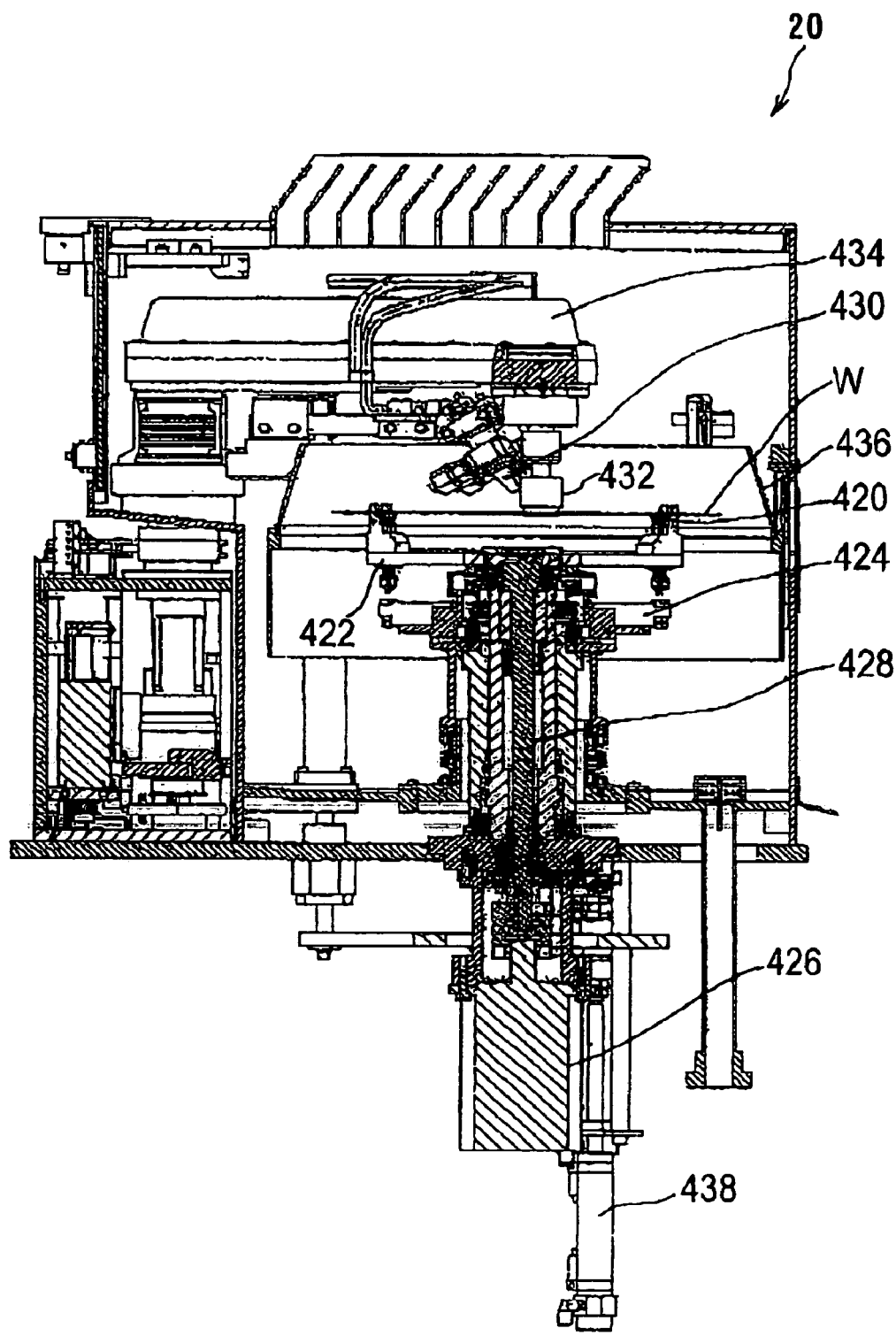
FIG. 20 is a vertical sectional front view of a drying unit of the substrate processing apparatus shown in FIG. 3.

FIG. 20 shows the drying unit 20. The drying unit 20 is a unit for first carrying out chemical cleaning and pure water cleaning of the substrate W, and then fully drying the cleaned substrate W by spindle rotation, and includes a substrate stage 422 provided with a clamping mechanism 420 for clamping an edge portion of the substrate W, and a substrate attachment/detachment lifting plate 424 for opening/closing the clamping mechanism 420. The substrate stage 422 is coupled to the upper end of a spindle 428 that rotates at a high speed by the actuation of a spindle rotating motor 426.

Further, positioned on the side of the upper surface of the substrate W clamped by the clamping mechanism 420, there are provided a mega-jet nozzle 430 for supplying pure water to which ultrasonic waves from a ultrasonic oscillator have been transmitted during its passage through a special nozzle to increase the cleaning effect, and a rotatable pencil-type cleaning sponge 432, both mounted to the free end of a pivot arm 434. In operation, the substrate W is clamped by the clamping mechanism 420 and rotated, and the pivot arm 434 is pivoted while pure water is supplied from the mega-jet nozzle 430 to the cleaning sponge 432 and the cleaning sponge 432 is rubbed against the front surface of the substrate W, thereby cleaning the front surface of the substrate W. A cleaning nozzle (not shown) for supplying pure water is provided also on the side of the back surface of the substrate W, so that the back surface of the substrate W can also be cleaned with pure water sprayed from the cleaning nozzle.

The thus-cleaned substrate W is spin-dried by rotating the spindle 428 at a high speed.

A cleaning cup 436, surrounding the substrate W clamped by the clamping mechanism 420, is provided for preventing scattering of a cleaning liquid. The cleaning cup 436 is designed to move up and down by the actuation of a cleaning cup lifting cylinder 438.

It is also possible to provide the drying unit 20 with a cavi-jet function utilizing cavitation.

Figure 21:
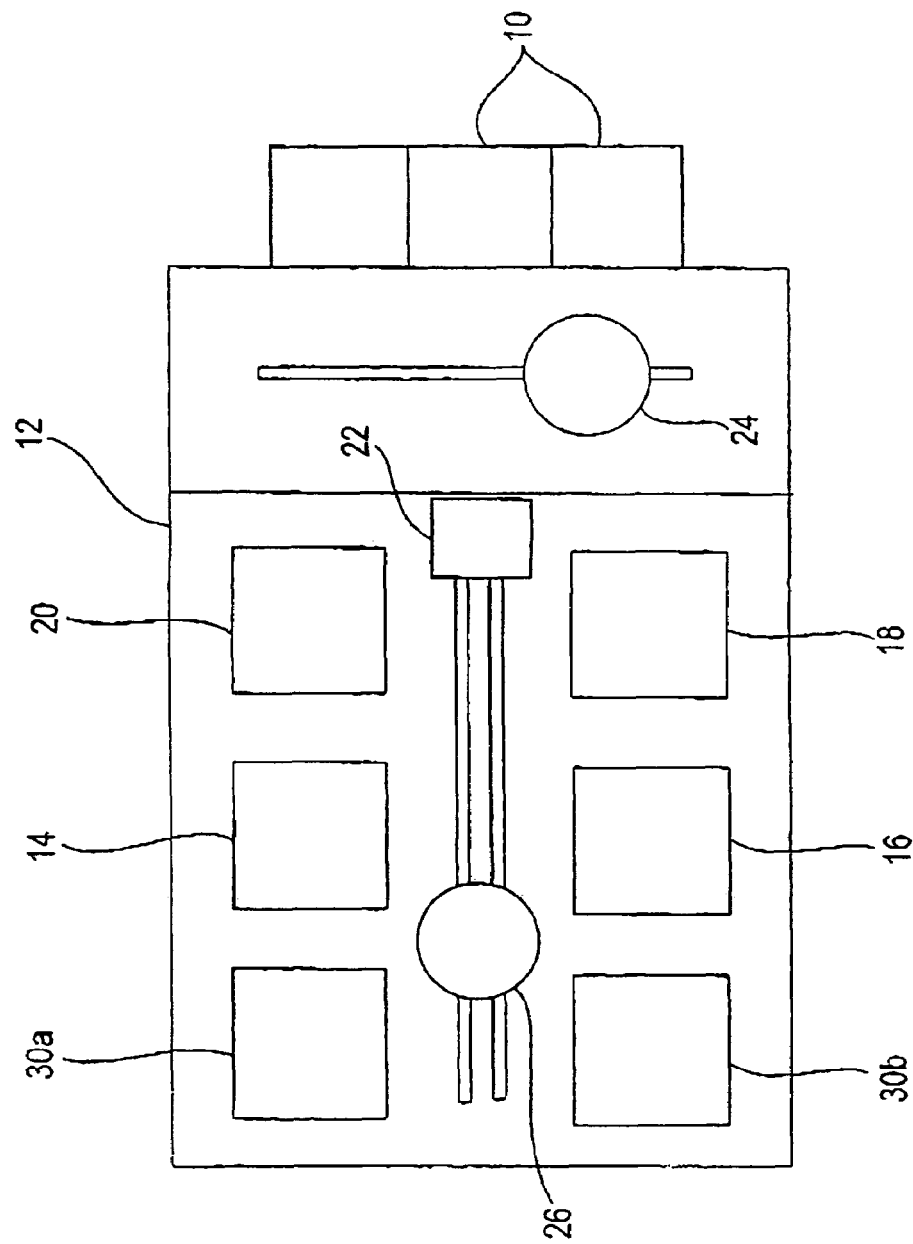
FIG. 21 is a layout plan view of a substrate processing apparatus according to another embodiment of the present invention.

FIG. 21 shows a substrate processing apparatus according to another embodiment of the present invention. The substrate processing apparatus differs from the above-described substrate processing apparatus shown in FIG. 3 in that one of the two integrated units (cleaning and catalyst application units) 14 is replaced with a first chemical-mechanical polishing unit (first CMP unit) 30a, and one of the two electroless plating units 16 is replaced with a second chemical-mechanical polishing unit (second CMP unit) 30b, and that a substrate cassette housing substrates W, each having a copper film 7 of interconnect material deposited in contact holes 3 and trenches 4 and on an insulating film 2, as shown in FIG. 1B, is housed in the loading/unloading unit 10. The other construction is substantially the same as the embodiment shown in FIG. 3.

Figure 22:
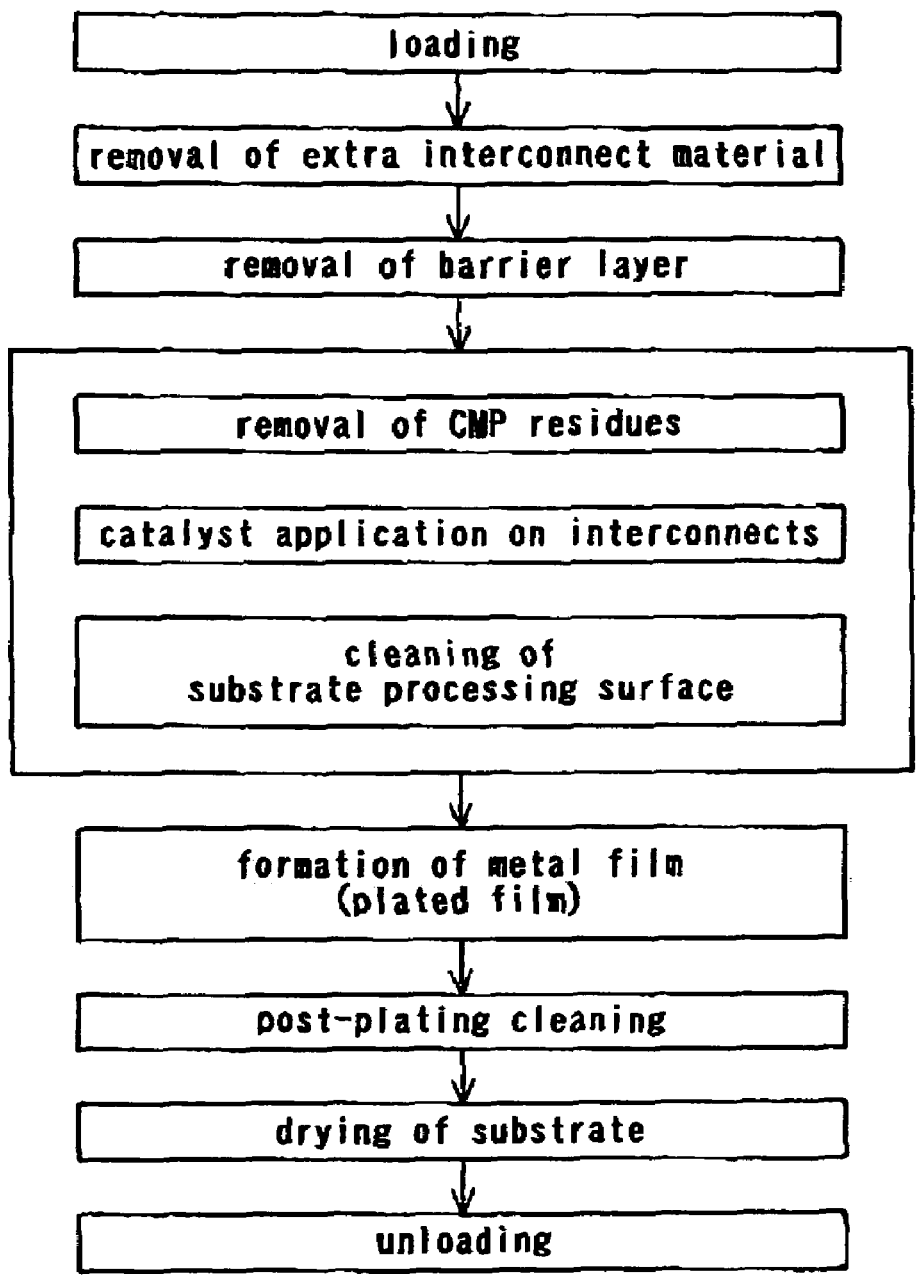
FIG. 22 is a flow chart of a substrate processing method according to another embodiment of the present invention as carried out by the substrate processing apparatus shown in FIG. 21.

A description will now be given of a series of substrate processings (electroless plating processings) as carried out by this substrate processing apparatus, by referring to FIG. 22.

First, one substrate W is taken by the first substrate transport robot 24 out of the cassette set in the loading/unloading unit 10 and housing substrates W with their front surfaces facing upwardly (face up), each substrate W having been subjected to the formation of copper film 7 on the surface, followed by drying, as shown in FIG. 1B, and the substrate W is transported to the temporary storage table 22 and placed on it. The substrate W on the temporary storage table 22 is transported by the second substrate transport robot 26 to the first CMP unit 30a. In the first CMP unit 30a, while rotating the substrate W which is held face down, the substrate W is pressed against a rotating polishing surface at a given pressure and, at the same time, a polishing liquid is supplied to the polishing surface, thereby mainly polishing away an extra copper (interconnect material) of the copper film 7. The polishing in the first CMP unit 30a is terminated when a barrier layer 5, as shown in FIG. 1B, has become exposed.

After rinsing (cleaning) the surface of the substrate W with pure water, according to necessity, the substrate W is transported by the second substrate transport robot 26 to the second CMP unit 30b. In the second CMP unit 30b, the barrier layer 5 on the insulating film 2 is mainly polished away in a similar manner to that in the first CMP unit 30a so that the surface of copper film 7 filled in the contact holes 3 and trenches 4 becomes substantially flush with the surface of the insulating film 2. Interconnects (copper interconnects)

8, consisting of the seed layer 6 and the copper film 7, are thus formed in the insulating film 2, as shown in FIG. 1C.

As with the case of the above-described substrate processing apparatus shown in FIG. 3, the substrate W after the formation of interconnects 8 is transported by the second substrate transport robot 26 to the integrated unit 14. In the integrated unit 14, the substrate W is held face down, and cleaning processing of the front surface of the substrate W is carried out as a post-CMP processing (or pre-plating processing), using the same cleaning solution (chemical solution) as used in the preceding embodiment, i.e. a chemical solution prepared by adding a surfactant and optionally a second chelating agent having a group other than carboxyl group to an aqueous solution of a carboxyl group-containing organic acid (first chelating agent), thereby etching away an oxide, etc. on the interconnects 8 and activating the surfaces of interconnects 8 and, at the same time, removing CMP residues remaining on the surface of the substrate W.

The subsequent process steps are the same as the preceding embodiment shown in FIG. 3, and hence a description thereof is omitted.

According to this embodiment, by installing the integrated unit 14 in the apparatus frame 12 housing the CMP units 30a, 30b and the electroless plating unit 16 therein, it becomes possible to eliminate a post-processing unit (cleaning unit) for carrying out a post-processing (cleaning) after CMP.

Figure 23:
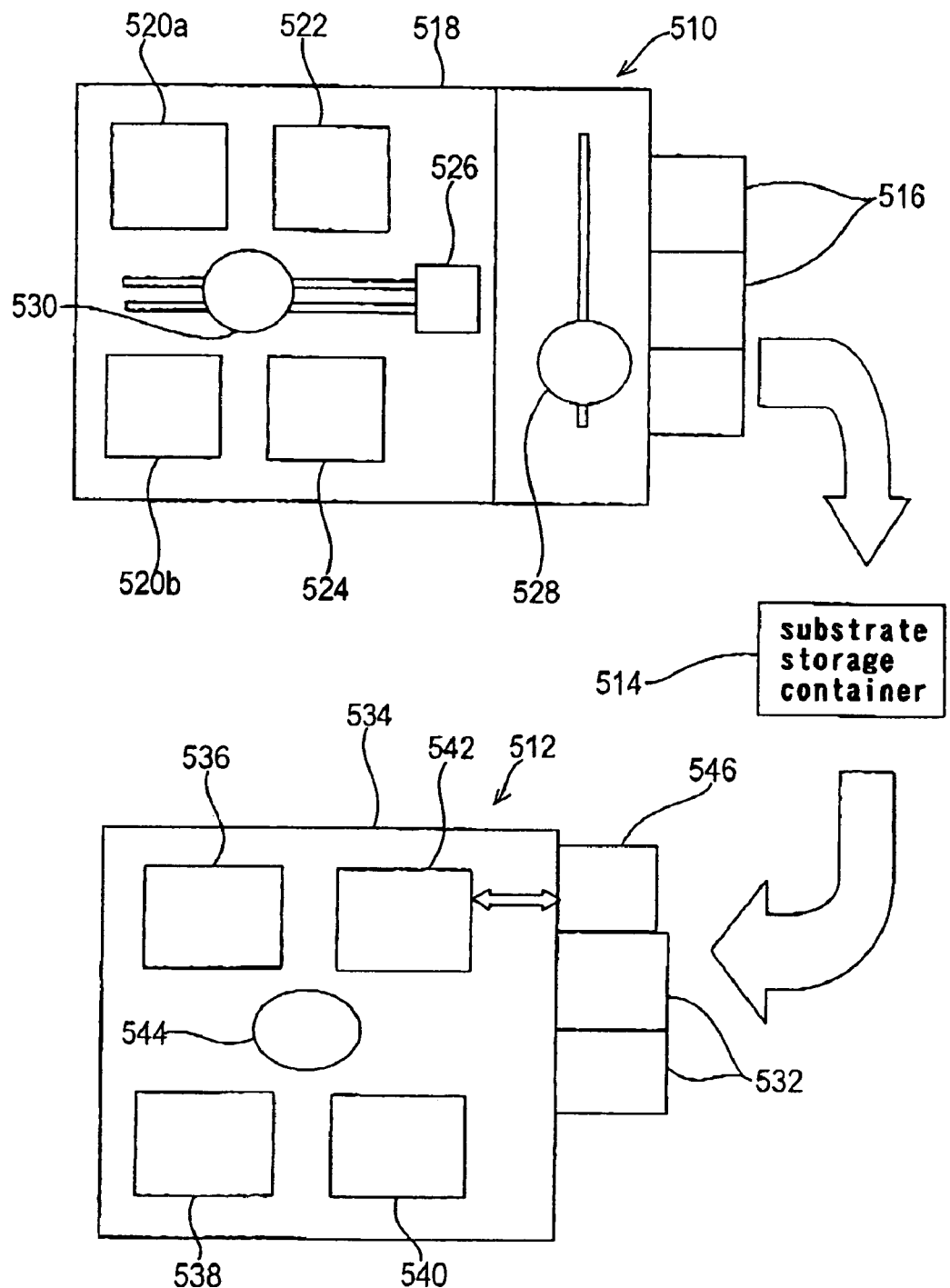
FIG. 23 is a layout plan view of a substrate processing apparatus according to yet another embodiment of the present invention.

FIG. 23 shows a layout plan view of a substrate processing apparatus according to yet another embodiment of the present invention. As shown in FIG. 23, the substrate processing apparatus comprises a chemical-mechanical polishing apparatus (CMP apparatus) 510, an electroless plating apparatus 512, and a storage container 514 for storing a substrate after processing in the CMP apparatus 510 and transporting the substrate to the electroless plating apparatus 512.

The CMP apparatus 510 includes a loading/unloading unit 516 for housing the storage container 514 and a substrate cassette housing substrates W each having a surface copper film 7 deposited on an insulating film 2 and copper as an interconnect material filled in contact holes 3 and trenches 4 (see FIG. 1B).

In a rectangular apparatus frame 518 provided with a ventilation system, there are disposed two chemical-mechanical polishing units (CMP units) 520a, 520b, an integrated unit (cleaning and catalyst application unit) 522 consisting of a cleaning unit for cleaning (post-CMP cleaning) of the surface of a substrate W and a catalyst application unit for applying a catalyst, such as Pd, to the surface of the substrate after cleaning, a drying unit 524 for rinsing and drying the substrate, and a temporary storage table 526 for temporarily storing the substrate. Further, a first substrate transport robot 528 for transporting the substrate W between the substrate cassette or the storage container 514 set in the loading/unloading unit 516 and the temporary storage table 526, and a second substrate transport robot 530 for transporting the substrate W between the temporary storage table 526 and the unit 520a, 520b, 522 or 524 are disposed movably in the apparatus frame 518.

The storage container 514 is comprised of an openable and closable hermetic container capable of controlling at least one of the internal humidity, temperature, oxygen concentration, and floating contaminant. The substrate W after processing in the CMP apparatus 510 is placed in the storage container 514, and stored and transported hermetically, controlled internal atmosphere. The container 514 can seal off the interior from the outside and can so control the internal atmosphere as to effectively prevent a change in the surface and interior conditions of interconnects 8 of, for example, copper, thus stabilizing or improving the substrate conditions before plating.

The electroless plating apparatus 512 includes a loading/unloading unit 532 for housing a substrate cassette and the storage container 514. In a rectangular apparatus frame 534 provided with a ventilation system, there are disposed an electroless plating unit 536 for carrying out electroless plating of the surface (processing surface) of the substrate W, a post-plating processing unit 538 for carrying out post-plating processing of the substrate W to enhance the selectivity of a protective film (alloy film) 9 (see FIG. 1D) formed by electroless plating on the surfaces of interconnects 8, a drying unit 540 for drying the substrate W after the post-processing, a film thickness/film property measurement unit 542 for measuring at least one of the film thickness and a film property of the protective film 9, and a substrate transport unit 544 for transporting the substrate W. The electroless plating apparatus 512 also includes a process control unit 546 for controlling the plating conditions based on the results of measurement by the film thickness/film property measurement unit 542.

Figure 24:
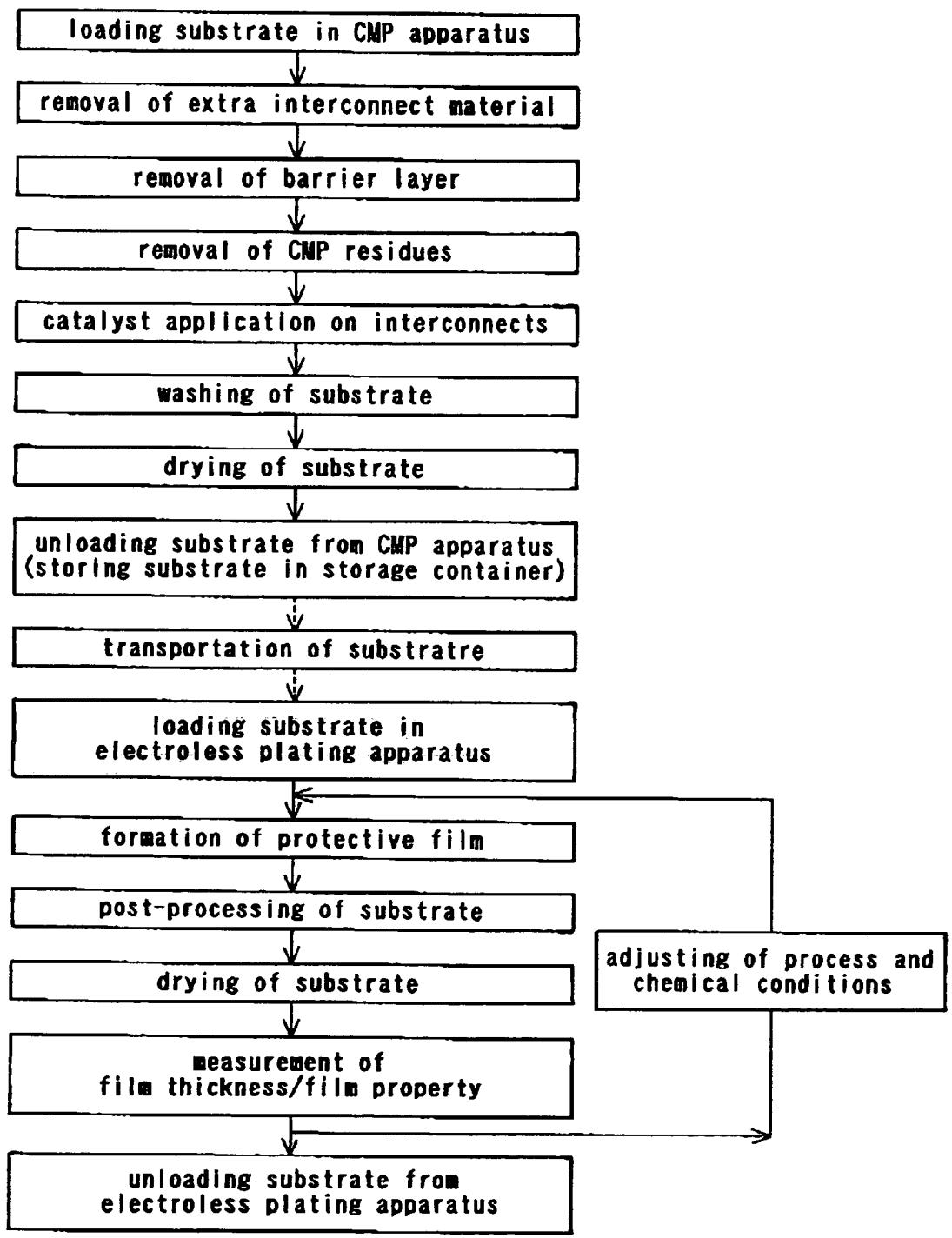
FIG. 24 is a flow chart of a substrate processing method according to an embodiment of the present invention as carried out by the substrate processing apparatus shown in FIG. 23.

A description will now be given of a series of substrate processings (electroless plating processings) as carried out by this substrate processing apparatus shown in FIG. 23, by referring to FIG. 24.

First, one substrate W is taken by the first substrate transport robot 528 out of the cassette set in the loading/unloading unit 516 of the CMP apparatus 510 and housing substrates W with their front surfaces facing upwardly (face up), each substrate W having been subjected to the formation of copper film 7 on the surface, followed by drying, as shown in FIG. 1B, and the substrate W is carried into the apparatus frame 518 of the CMP apparatus 510 and placed on the temporary storage table 526. The substrate W on the temporary storage table 526 is transported by the second substrate transport robot 530 to one CMP unit 520a. In the CMP unit 520a, while rotating the substrate W which is held face down, the substrate W is pressed against a rotating polishing surface at a given pressure and, at the same time, a polishing liquid is supplied to the polishing surface, thereby mainly polishing away an extra copper (interconnect material) of the copper film 7. The polishing in the CMP unit 520a is terminated when a barrier layer 5, as shown in FIG. 1B, has become exposed.

After rinsing (cleaning) the surface of the substrate W with pure water, according to necessity, the substrate W is transported by the second substrate transport robot 530 to the other CMP unit 520b. In the CMP unit 520b, the barrier layer 5 on the insulating film 2 is mainly polished away in a similar manner to that in the CMP unit 520a so that the surface of copper film 7 filled in the contact holes 3 and trenches 4 becomes substantially flush with the surface of the insulating film 2. Interconnects (copper interconnects) 8, consisting of the seed layer 6 and the copper film 7, are thus formed in the insulating film 2, as shown in FIG. 1C.

After rinsing (cleaning) the surface of the substrate W, according to necessity, the substrate W is transported to the integrated unit 522. In the integrated unit 522, the substrate W is held face down, and cleaning of the surface of the substrate with a cleaning solution (chemical solution) is first carried out as a post-CMP processing.

As with the above-described embodiment, an aqueous solution of a carboxyl group-containing organic acid (first chelating agent), to which is added a surfactant and optionally a second chelating agent having a group other than carboxyl group, may be used as the cleaning solution.

The cleaning solution is sprayed toward the surface of the substrate W, for example, for one minute to thereby etch away an oxide, etc. on the interconnects 8 and activate the surfaces of interconnects 8 and, at the same time, remove polishing residues remaining on the surface of the substrate W. Thereafter, the cleaning solution remaining on the surface of the substrate W is rinsed (cleaned) off with a rinsing liquid, such as pure water, according to necessity.

Next, while the substrate W is kept held face down in the integrated unit 522, catalyst application processing for applying a catalyst, such as Pd, to the surface of the substrate is carried out successively in the same manner as in the preceding embodiment using, for example, a processing solution comprising a mixture of a solution containing a catalyst metal ion and a cleaning solution containing a carboxyl group-containing organic acid (first chelating agent), a surfactant, and optionally a second chelating agent having a group other than carboxyl group.

The substrate W after the catalyst application processing is rinsed (cleaned) with pure water. Thereafter, the substrate W is transported by the second substrate transport robot 530 to the drying unit 524, where the substrate W is rinsed, according to necessity, and then spin-dried by rotating the substrate W at a high speed.

The substrate W after spin-drying is transported by the second substrate transport robot 530 to the temporary storage table 526 and placed on it. The substrate W on the temporary storage table 526 is transported by the first substrate transport robot 528 to the storage container 514 set in the loading/unloading unit 516 and placed in the storage container 514 for storage.

When, for example, the number of substrates stored in the storage container 514 has reached a predetermined number, the storage container 514 is taken out of the loading/unloading unit 516 of the CMP apparatus 510, and is transported to and set in the loading/unloading unit 532 of the electroless plating apparatus 512.

By thus removing the polishing residues on the substrate and an oxide film in the surfaces of interconnects 8 immediately after CMP and storing the substrate, after the catalyst application to the surfaces of interconnects 8, in the CMP apparatus 510, and storing the substrate in the storage container 514 having a controlled internal atmosphere, a change in the surface and interior conditions of interconnects 8 of, for example, copper, which could lower the reliability of the interconnects 8 or exert an uncertain adverse effect on the later formation of a protective film 9, can be prevented. Further, the surface of copper interconnects 8, to which a catalyst such as Pd has been applied, is generally more stable than the copper surface before catalyst application. This also contributes to suppression of the surface oxidation of copper interconnects 8.

Next, one substrate W is taken by the substrate transport unit 544 out of the storage container 514 set in the loading/unloading unit 532 of the electroless plating apparatus 512, and the substrate W is carried into the apparatus frame 534 of the electroless plating apparatus 512 and transported to the electroless plating unit 536. In the electroless plating unit 536, electroless plating of the catalyst-applied surface of the substrate W is carried out in the same manner as in the above-described embodiment, followed by rinsing (cleaning) off of the plating solution remaining on the surface of the substrate, thereby forming a protective film 9 of a CoWP alloy selectively on the surfaces of interconnects 8 to protect the interconnects 8.

Next, the substrate W after the electroless plating processing is transported by the substrate transport unit 544 to the post-plating processing unit 538, where post-plating processing (post-cleaning) of the surface of the substrate W is carried out in the same manner as in the above-described embodiment to enhance the selectivity of the protective film (metal film) 9 formed on the surface of the substrate W. It is also possible to selectively remove, by etching, impurities remaining on a nonmetallic surface, such as the insulating film (interlevel dielectric film) 2, of the substrate, or to selectively remove or modify such impurities by plasma processing.

The substrate W after the post-plating processing is transported by the substrate transport unit 544 to the drying unit 540, where the substrate W is rinsed, according to necessity, and is then spin-dried by rotating the substrate W at a high speed.

The substrate W after spin-drying is transported by the substrate transport unit 544 to the film thickness/film property measurement unit 542. In the film thickness/film property measurement unit 542, at least one of the film thickness and a film property of the protective film 9 formed on the interconnects 8 is measured, according to necessity. The substrate W after the measurement is transported by the substrate transport unit 544 to the substrate cassette set in the loading/unloading unit 532 and placed in the cassette.

The results of measurement of the film thickness and/or the film property of the protective film 9 are inputted to the process control unit 546. By comparison of the measured value with a target value, based on the difference between the measured value and a target value in terms of the film thickness or film properly, the plating conditions for the next substrate, for example, the plating time and the components of the chemical solution (plating solution) are adjusted. The film thickness and/or the film property of a protective film 9 to be formed on the surfaces of interconnects 8 can thus be controlled.

By thus forming a protective film 9 by electroless plating on the surfaces of interconnects 8 directly, to which a catalyst has previously been applied, in the electroless plating apparatus 512 without carrying out the catalyst application processing in the electroless plating apparatus 512, it becomes possible to increase the throughput of plating and to eliminate the need to install a pre-processing unit in the electroless plating apparatus 512, thus decreasing the footprint of the apparatus.

It is preferred that a substrate be transported in the dried state between each unit and the transport robot.

In the embodiment shown in FIG. 23, the integrated unit 14 shown in FIG. 5 through 11 is used as the integrated unit (cleaning and catalyst application unit) 552. Further, the electroless plating unit 16 shown in FIGS. 12 through 18, the post-plating processing unit 18 shown in FIG. 19 and the drying unit 20 shown in FIG. 20 are used as the electroless plating unit 536, the post-plating processing unit 538 and the drying unit 524 or 540, respectively.

FIG. 25 shows a layout plan view of a substrate processing apparatus according to yet another embodiment of the present invention. As shown in FIG. 25, the substrate processing apparatus includes a loading/unloading unit 612 for housing a substrate cassette 610 that houses substrates W, such as semiconductor devices, each having interconnects (base metal) 8 of, for example, copper formed in fine interconnect recesses 4 formed in the surface. Along one long side of a rectangular apparatus frame 616 provided with a ventilation system, there are disposed in series a first pre-processing (pre-cleaning) unit 618 for carrying out precleaning (pre-processing) of a substrate W, a second pre-processing (catalyst application) unit 620 for applying a catalyst to the exposed surfaces of interconnects 8 after pre-cleaning, and an electroless plating unit 622 for carrying out electroless plating of the surface (processing surface) of the substrate W.

Further, along the other long side of the apparatus frame 616 are disposed in series a post-plating processing unit 624 for carrying out post-plating processing of the substrate W to enhance the selectivity of a protective film (metal film) 9 which has been formed by the electroless plating on the surfaces of interconnects 8, a drying unit 626 for drying the substrate W after the post-processing, a heat treatment unit 628 for heat-treating (annealing) the substrate W after drying, and a film thickness measurement unit 630 for measuring the film thickness of the protective film 9 formed on the interconnects 8. Further, a transport robot 634, which is movable on a rail 632 parallel to the long sides of the apparatus frame 616 and transfers a substrate between it and each unit or the substrate cassette 610 set in the loading/unloading unit 612, is disposed centrally between the two lines of units.

The apparatus frame 616 is designed to be light shielding so that the below-described process steps can be carried out under light-shielded conditions in the apparatus frame 616, i.e. without irradiation of a light, such as an illuminating light, onto interconnects. This can prevent corrosion of interconnects of, for example, copper due to a potential difference that would be produced by light irradiation onto interconnects.

Figure 26:
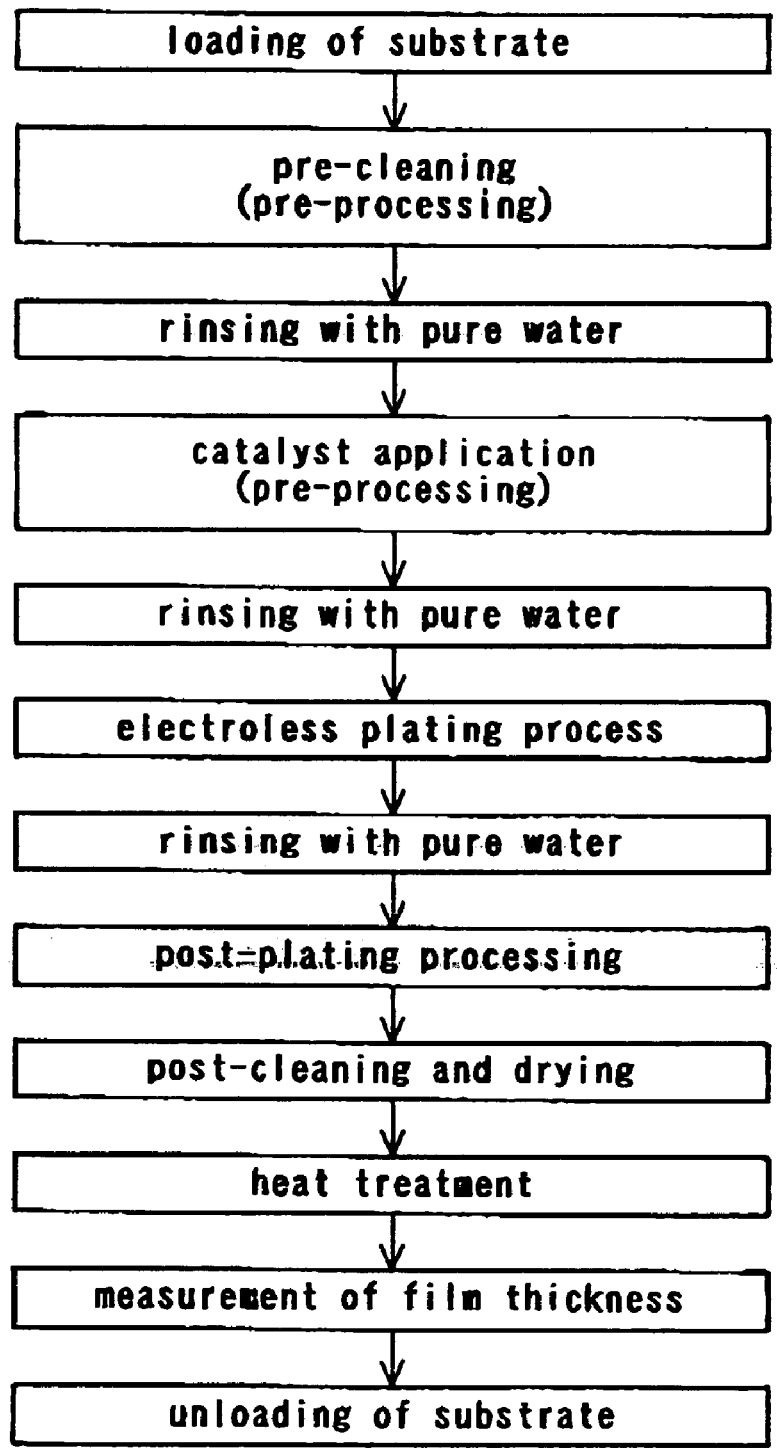
FIG. 26 is a flow chart of a substrate processing method according to an embodiment of the present invention as carried out by the substrate processing apparatus shown in FIG. 25.
Figure 27:
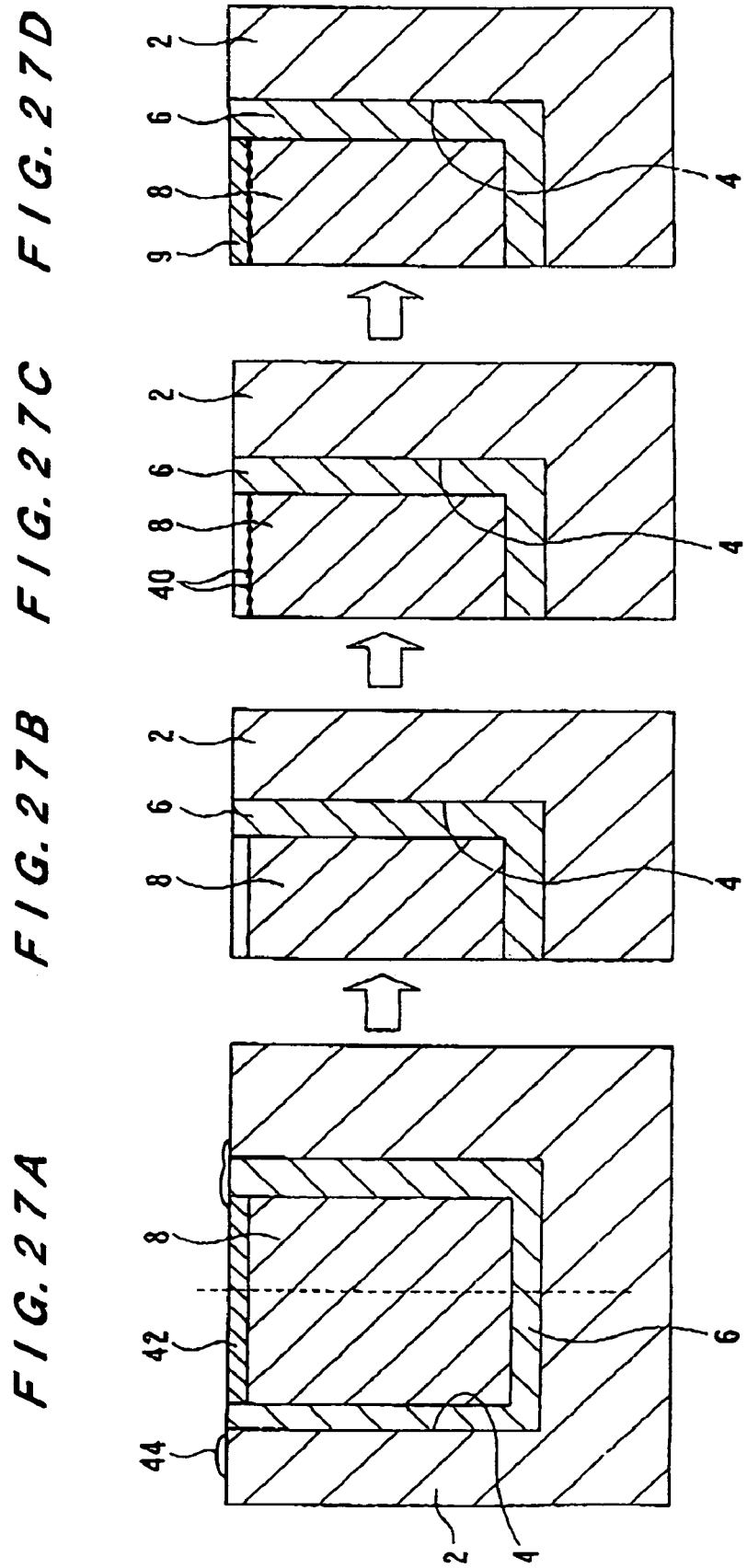
FIG. 27A through 27D are schematic cross-sectional diagrams illustrating, in a sequence of process steps, a series of processings as carried out by the substrate processing apparatus shown in FIG. 25.

A description will now be given of a series of substrate processings (electroless plating processings) as carried out by the substrate processing apparatus shown in FIG. 25, by referring to FIGS. 26 through 28.

First, one substrate W is taken by the transport robot 634 out of the cassette 610 set in the loading/unloading unit 612 and housing substrate W with their front surfaces facing upwardly (face up), each substrate W having been subjected to the formation of interconnects 8 in the surface, followed by drying, and the substrate W is transported to the first pre-processing unit 618. In the first pre-processing unit 618, the substrate W is held face down, and pre-cleaning processing (chemical cleaning) as a pre-plating processing is carried out on the front surface. For example, a processing solution (cleaning chemical), such as diluted $H_2SO_4$, at a liquid temperature of e.g. 25° C. is sprayed toward the surface of the substrate W to thereby remove CMP residues 44, such as copper, remaining on the surface of insulating film 2, a metal (copper) oxide 42 on the interconnects 8, etc., as shown in FIGS. 27A and 27B. Thereafter, the cleaning chemical remaining on the surface of the substrate W is rinsed (cleaned) off with a rinsing liquid, such as pure water.

Usable processing solutions include an inorganic acid with a pH of not more than 2, such as hydrofluoric acid, sulfuric acid or hydrochloric acid; an acid with a pH of not more than 5 and having chelating ability, such as formic acid, acetic acid, oxalic acid, tartaric acid, citric acid, maleic acid or salicylic acid; and an acid with a pH of not more than 5 to which is added a chelating agent such as a halide, a carboxylic acid, a dicarboxylic acid, an oxycarboxylic acid, or a water-soluble salt thereof. By carrying out pre-cleaning of the substrate with such a processing solution, the CMP residues 44, such as copper, remaining on the insulating film 2 and the metal oxide 42 in the surfaces of interconnects 8 can be removed, whereby plating selectivity and adhesion of a plated film to the interconnects 8, can be enhanced. An anticorrosive agent, which is generally used in CMP, usually acts as an inhibitor against deposition of a plated film. Such an anticorrosive agent can be effectively removed by using an alkali chemical capable of removing an anticorrosive agent adhering to interconnects 8, for example, tetramethylammonium hydroxide (TMAH). The same effect as produced by the above-described acids can also be produced by an alkaline solution of an amino acid, such as glycine, cysteine, methionine, etc.

It is desirable that the pre-cleaning (pre-processing) of the surface of the substrate W, including the surfaces of interconnects 8, be carried out in a processing solution (cleaning chemical) having a dissolved oxygen concentration of not more than 3 ppm. This can reduce reaction of interconnects 8 with dissolved oxygen during pre-processing, thus preventing a loss in the reliability of interconnects 8.

Other processings, such as rinsing and catalyst application processing, may also be preferably carried out in a processing liquid having a dissolved oxygen concentration of not more than 3 ppm so as to reduce reaction of interconnects 8 with dissolved oxygen during processing.

The rinsing (cleaning) with a rinsing liquid of the surface of the substrate W after pre-cleaning can prevent the chemical used in the pre-cleaning from remaining on the surface of the substrate W and hindering the next activation step. Ultrapure water is generally used as a rinsing liquid. Depending upon the material of the interconnect surface, however, the interconnect material can corrode, for example due to local cell effect, even when ultrapure water is used. It is desirable, in such a case, to use as a rinsing liquid water containing no impurity and having high reducing powder, such as hydrogen gas-dissolved water obtained by dissolving hydrogen gas in ultrapure water, or electrolytic cathode water obtained by subjecting ultrapure water to diaphragm-type electrolysis. In order to prevent possible corrosion of interconnect material, etc., by the chemical used in pre-cleaning, the time between pre-cleaning and rinsing is preferably as short as possible.

Next, the substrate W after pre-cleaning processing is transported by the transport robot 634 to the second pre-processing unit 620, where the substrate W is held face down and subjected to catalyst application processing (pre-processing) to apply a catalyst, such as Pd, to the surfaces of interconnects 8. For example, a processing solution (catalyst solution), for example, a solution containing $PdCl_2$, HCl, etc., at a liquid temperature of 25° C. is sprayed toward the surface of the substrate W, e.g. for one minute to thereby attach Pd as a catalyst metal (seeds) 40 to the surfaces of interconnects 8, i.e., form Pd seeds as catalyst metal seeds on the surfaces of interconnects 8, thereby activating the exposed surfaces of interconnects 8, as shown in FIG. 27C. Thereafter, the processing solution (catalyst solution) remaining on the surface of the substrate W is rinsed (cleaned) off with a rinsing liquid, such as pure water.

A solution containing, besides a catalyst metal ion, a component for forming a complex with interconnects as a base metal, is used as the processing solution (catalyst processing solution). Usable catalyst metal ions include, besides Pd ion used in this embodiment, Sn ion, Ag ion, Pt ion, Au ion, Cu ion, Co ion and Ni ion. The use of Pd ion is especially preferred from the viewpoints of reaction rate, easiness of control, etc. A nitrogen-containing organic compound or a carboxyl group-containing organic compound can be used as the component for forming a complex with interconnects (base metal) 8.

A nitrogen-containing organic compound, because of the polarity of the nitrogen in the molecular structure, is electrostatically attracted to and adsorbed on the surfaces of interconnects 8. This can prevent excessive reaction of the catalyst metal (seeds) 40 with interconnects 8, as described below. Examples of usable nitrogen-containing organic compounds include nitrogen-containing polymers, such as a quaternary salt of polydialkylaminoethyl acrylate, polyallyldimethylammonium chloride, polyethylene imine, a quaternary salt of polyvinyl pyridine, polyvinyl amidine, polyallyl amine and polyamine sulfonic acid. Such a nitrogen-containing polymer is used in an amount of about 0.01 to 1000 ppm, preferably about 1 to 100 ppm in the processing solution. The molecular weight of the nitrogen-containing polymer is preferably not less than 100, more preferably not less than 1000.

In the case of using a carboxyl group-containing organic compound in the processing solution, the carboxyl group-containing organic compound preferably has two or more carboxyl groups or has capability to form a complex with a base metal. When an organic compound having two or more carboxyl groups is used, at least one carboxyl group can be adsorbed onto interconnects 8, whereby the catalyst metal (seeds) 40 can be prevented from reacting excessively with interconnects 8. The carboxyl group-containing organic compound is used in an amount of about 0.01 to 100 g/L, preferably about 0.1 to 10 g/L in the processing solution.

Figure 28:
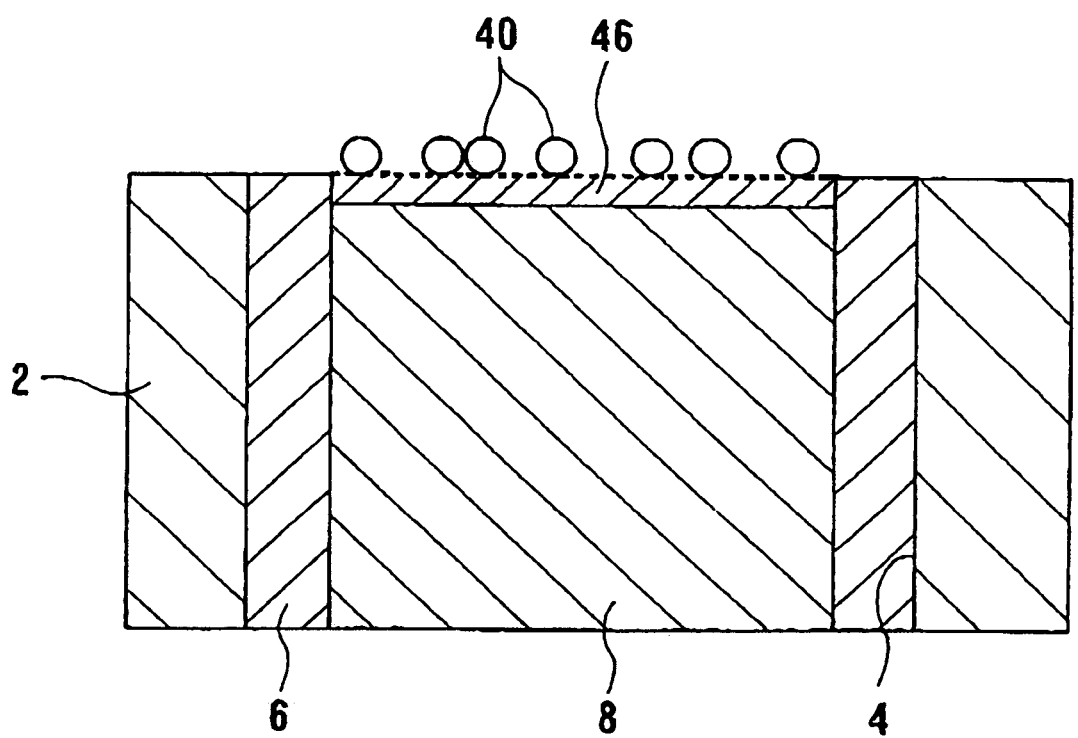
FIG. 28 is an enlarged schematic diagram showing the state of the base metal after catalyst application illustrated in FIG. 27D.
Figure 29:
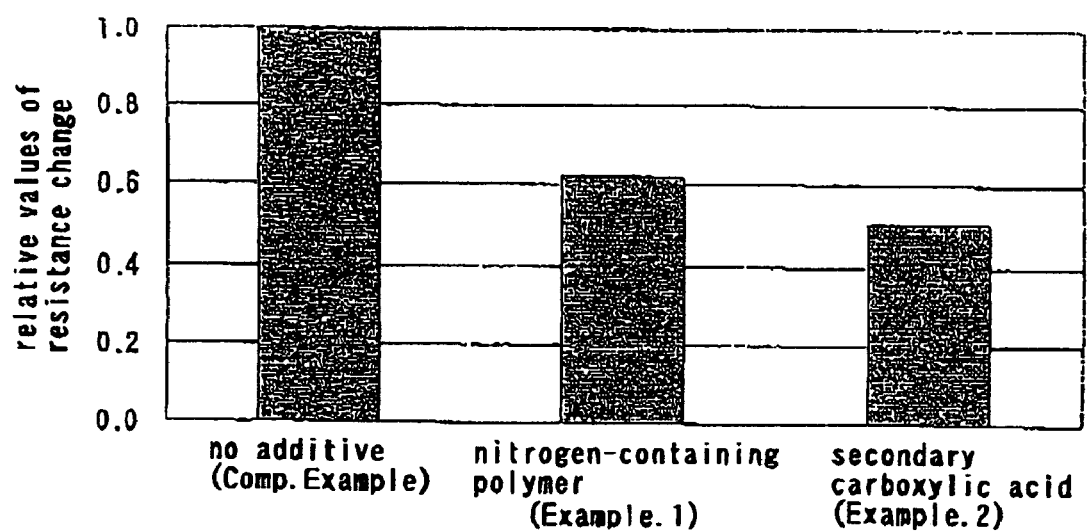
FIG. 29 is a graph showing the rates of resistance change in Examples 1 and 2 and Comparative Example.

By thus carrying out catalyst application processing (pre-processing) of the surfaces of interconnects 8 with the processing solution (catalyst solution) containing a catalyst metal ion and a component for forming a complex with the interconnects 8, for example, a nitrogen-containing polymer, a protective layer 46, comprising a complex of the nitrogen-containing polymer with the material of interconnects 8, for example copper, can be formed in the surfaces of interconnects 8, as shown in FIG. 28. The protective layer 46 can carry the catalyst metal (seeds) 40 on its surface while protecting the surfaces of interconnects 8. The complex is preferentially adsorbed onto a corrosion-prone portion of the surfaces of interconnects 8. This enables application of the catalyst to the surfaces of interconnects 8 without lowering of the structure or the physical properties of interconnects 8 due to etching, etc.

The application of a catalyst to the surfaces of interconnects 8 can enhance the selectivity of electroless plating. Though a variety of catalyst metals can be used as catalyst, it is preferred to use Pd from the viewpoints of reaction rate, easiness of control, etc. Methods for the catalyst application include a method of immersing the whole substrate in a catalyst solution and a method of spraying a catalyst toward a surface of a substrate. Either one of the two methods can be chosen depending on the composition of plated film, the requisite thickness of plated film, etc. For the formation of a thin film, the spray method is generally superior in the reproducibility, etc.

In order to enhance the selectivity, it is necessary to remove Pd remaining on the insulating film 2 and interconnects 8. To this end, ultrapure water rinsing is generally employed. As with the case of the pre-cleaning processing, the processing solution (catalyst solution) remaining on the surface of the substrate can exert an adverse influence on interconnect material, such as corrosion, and on the plating step. It is therefore desirable that the time between the catalyst application processing and the rinsing be as short as possible. As with the case of the pre-cleaning processing, ultrapure water, hydrogen gas-dissolved water or electrolytic cathode water may be used as a rinsing liquid. Alternatively, in order to make the substrate better adapt to an electroless plating solution which is used in the next plating step, it is also possible to use an aqueous solution of a component(s) of the electroless plating solution.

After a catalyst metal (seeds) is carried on the surfaces of interconnects 8 and the surface is rinsed, the substrate W is transported to the electroless plating unit 622 by the transport robot 634, where an electroless plating process is performed onto the surface of the substrate W. Specifically, the substrate W is immersed, for example, in a CoWP plating solution at the solution temperature of 80° C. for about 120 seconds to carry out electroless plating (electroless CoWP cap plating) selectively on surfaces of the interconnects 8 on which a catalyst metal (seeds) has been carried so as to selectively form a protective film (cap material) 9, as shown in FIG. 27D. The composition of the plating solution is as follows.

$CoSO_4 \cdot 7H_2O$: 14 g/L
$Na_3C_6H_5O_7 \cdot 2H_2O$: 80 g/L
$HBO_3$: 30 g/L
$NaH_2PO_2$: 20 g/L
$Na_2WO_4 \cdot 2H_2O$: 40 g/L
pH: 9.2 (adjusted by aqueous NaOH)

Then, after the substrate W is pulled up from the plating solution, a stop liquid of a neutral liquid having a pH of 6 to 7.5 is brought into contact with the surface of the substrate W to stop the electroless plating process. Thus, the plating reaction is quickly stopped immediately after the substrate W is pulled up from the plating solution, to thereby prevent plating unevenness from being produced on the plated film. It is desirable that this processing time be, for example, 1 to 5 seconds. Pure water, hydrogen gas dissolved water, or electrolytic cathode water is used as the stop liquid.

Thereafter, a plating solution remaining on the surface of the substrate is rinsed (cleaned) off with a rinsing liquid, such as pure water. Thus, a protective film 9 of a CoWP alloy film is formed selectively on surfaces of interconnects 8 to protect interconnects 8.

Next, the substrate W after the electroless plating is transported by the transport robot 634 to the post-processing unit 624, where the substrate W is subjected to post-processing in order to enhance the selectivity of the protective film (alloy film) 9 formed on the surfaces of interconnects 8 and thereby increase the yield.

The substrate W after the post-processing is transported by the transport robot 634 to the drying unit 626, where the substrate W is rinsed, according to necessity, and then rotated at a high speed to spin-dry the substrate W.

The substrate W after the spin-drying is transported to the heat treatment unit 628 by the transport robot 634. In the heat treatment unit 628, a heat treatment (annealing) is performed on the substrate W after the post-processing to reform the protective film 9. It is desirable that the temperature required for reforming the protective film 9 be at least 120° C. in consideration of practical processing time and not more than 450° C. in consideration of heat resistance of materials forming devices. For example, the temperature of the heat treatment (annealing) is 120 to 450° C. Thus, when the heat treatment is performed on the substrate W, it is possible to improve the barrier properties of the protective film 9 formed on exposed surfaces of interconnects and the adhesiveness to interconnects.

Next, the substrate W after the heat treatment is transported to the film thickness measurement unit 630, such as an optical measurement unit, an AFM, or an EDX, by the transport robot 634. In the film thickness measurement unit 630, the film thickness of the protective film 9 formed on the surfaces of interconnects 8 is measured, and the substrate W after the film thickness measurement is returned to the substrate cassette 610 loaded on the loading/unloading unit 612 by the transport robot 634.

In the embodiment shown in FIG. 25, the integrated unit 14 shown in FIG. 5 through 11 is used as the first pre-processing unit 618 and the second pre-processing unit 620. Further, the electroless plating unit 16 shown in FIGS. 12 through 18, the post-plating processing unit 18 shown in FIG. 19 and the drying unit 20 shown in FIG. 20 are used as the electroless plating unit 622, the post-plating processing unit 624 and the drying unit 626, respectively.

According to this embodiment, the first pre-processing unit 618 and the second pre-processing unit 620, both having the same construction but using different processing solutions, are provided to carry out pre-cleaning and catalyst application processing, respectively. It is also possible to effect pre-cleaning and catalyst application simultaneously by carrying out pre-processing using a processing solution containing a component for forming a complex with interconnects (base metal) 8, a catalyst metal ion and an acid having a function of cleaning the surfaces of interconnects 8.

Also in this case, by carrying out pre-processing of the surfaces of interconnects (base metal) 8 with the processing solution containing, besides a component for forming a complex with the interconnects and a catalyst metal ion, an acid having a function of cleaning the surfaces of interconnects 8, a metal oxide 42 in the surfaces of interconnects 8, CMP residues 44 on the interconnects 8, etc. can be removed (cleaned off), as shown in FIGS. 27A through 27C with FIG. 27B skipped, and at the same time, a protective layer 46, comprising a complex of the complexing component with the interconnect material, such as copper, can be formed in the surfaces of interconnects 8, as shown in FIG. 28. The protective layer 46 can carry a catalyst metal (seeds) 40, such as Pd, on its surface while protecting the surfaces of interconnects 8. This enables application of the catalyst to the surfaces of interconnects 8 without lowering of the structure or the physical properties of interconnects 8 due to etching, etc.

It is also possible to carry out pre-cleaning by the first pre-processing unit 618 using a processing solution (cleaning chemical) containing, besides an acid having a function of cleaning the surfaces of interconnects 8, a component for forming a complex with the interconnects 8, and after rinsing, carry out catalyst application processing by the second pre-processing unit 620 using a common processing solution (catalyst solution) containing a catalyst metal ion and not containing a component for forming a complex with the interconnects 8.

By thus cleaning the surfaces of interconnects 8 with the processing solution containing, besides an acid having a function of cleaning the surfaces of interconnects 8, a component for forming a complex with the interconnects 8, a metal oxide 42 in the surfaces of interconnects 8, CMP residues 44 on the surfaces of interconnects 8, etc. can be removed (cleaned off), as shown in FIGS. 27A and 27B, and at the same time, a protective layer 46, comprising a complex of the complexing component with, for example, copper constituting the interconnects 8, can be formed in the surfaces of interconnects 8, as shown in FIG. 28. Upon catalyst application to the surfaces of interconnects 8, a catalyst metal (seeds) 40, such as Pd, is carried on the protective layer 46 previously formed in the surfaces of interconnects 8, as shown in FIGS. 27C and FIG. 28. This can prevent the structure or the physical properties of the interconnects 8 from being damaged due to etching, etc.

with the protective layer 46 and prevent mixing of impurities into the processing solution containing the catalyst metal.

Though the above-described embodiments illustrate the case of forming a protective film 9 on the surfaces of embedded interconnects 8 formed in a substrate, it is also possible to form a conductive film (metal film), having a function of preventing diffusion of an interconnect material into an interlevel dielectric film, on the bottom and the sides of the embedded interconnects 8 in a similar manner.

EXAMPLE 1

A sample was prepared by forming embedded interconnects (isolated interconnects) having a width of 0.25 μm, a depth of 0.45 μm and a length of 3,185 μm in the surface of a silicon substrate. The surface of the sample was allowed to be in contact with (immersed in) diluted 0.5 M oxalic acid for 60 seconds to clean the surface of the sample, followed by rinsing with pure water for 60 seconds. Thereafter, the surface of the sample was allowed to be in contact with (immersed in) a processing solution (catalyst solution) containing a catalyst metal ion (Pd ion) and a nitrogen-containing polymer (50 ppm) for 60 seconds to carry out catalyst application processing, followed by rinsing with pure water for 60 seconds. Next, the surface of the sample was allowed to be in contact with (immersed in) an electroless CoWP-plating solution for 120 seconds to carry out electroless plating processing.

The resistance values of the interconnects before and after the series of electroless plating processings (cap plating processings) were measured to determine the rate of resistance change. The rate of resistance change δ is defined as the ratio of the difference between a resistance $R_1$ after processing and a resistance $R_2$ before processing to the resistance $R_2$ before processing [$\delta=(R_1-R_2)/R_2$].

EXAMPLE 2

The same sample as in Example 1 was prepared. The surface of the sample was allowed to be in contact with (immersed in) diluted 0.5 M oxalic acid for 60 seconds to clean the surface of the sample, followed by rinsing with pure water for 60 seconds. Thereafter, the surface of the sample was allowed to be in contact with (immersed in) a processing solution (catalyst solution) containing a catalyst metal ion (Pd ion) and a secondary carboxylic acid (10 g/L) for 60 seconds to carry out catalyst application processing, followed by rinsing with pure water for 60 seconds. Next, the surface of the sample was allowed to be in contact with (immersed in) the electroless CoWP-plating solution for 120 seconds to carry out electroless plating processing.

As with Example 1, the resistance values of the interconnects before and after the series of electroless plating processings were measured to determine the rate of resistance change.

COMPARATIVE EXAMPLE

The same sample as in Example 1 was prepared. The surface of the sample was allowed to be in contact with (immersed in) an inorganic acid for 60 seconds to clean the surface of the sample, followed by rinsing with pure water for 60 seconds. Thereafter, the surface of the sample was allowed to be in contact with (immersed in) a processing solution (catalyst solution) containing a catalyst metal ion (Pd ion) for 60 seconds to carry out catalyst application processing, followed by rinsing with pure water for 60 seconds. Next, the surface of the sample was allowed to be in contact with (immersed in) the electroless CoWP-plating solution for 120 seconds to carry out electroless plating processing.

As with Example 1, the resistance values of the interconnects before and after the series of electroless plating processings were measured to determine the rate of resistance change.

FIG. 28 shows the rates of resistance change in the Examples, as expressed by relative values with the rate of resistance change in Comparative Example taken as 1.0. As can be seen from FIG. 28, the rise in the resistance of interconnects after the series of electroless plating processings is considerably smaller for Examples 1 and 2 as compared to Comparative Example.

According to the present invention, interconnects, e.g. copper interconnects, can be prevented from being excessively etched locally, especially along the weak crystal grain boundaries or along the interfaces between the interconnects and a barrier layer, during catalyst application processing, and a metal film (protective film) can be formed securely by electroless plating on the exposed surfaces of the interconnects (base metal). This makes it possible to selectively cover and protect the surfaces of interconnects of a semiconductor device having an embedded interconnect structure with a protective film without a lowering of the reliability of the interconnects and an increase in the resistance of the interconnects.

According to the present invention, by removing polishing residues on a substrate and an oxide film in the surfaces of interconnects immediately after polishing, and cleaning and drying the substrate after application of a catalyst to the surfaces of interconnects, the oxidation of the surfaces of interconnects of, for example, copper can be suppressed. Further, by storing the substrate, after the catalyst application and drying, in a storage container having a controlled internal atmosphere, a change in the surface and interior conditions of the interconnects can be prevented during the storage of the substrate. This makes it possible to stably from a metal film (protective film) on the surfaces of interconnects after CMP without lowering the reliability of the interconnects and to increase the throughput.

Furthermore, according to the present invention, preprocessing, such as catalyst application processing or precleaning, can be carried out with a processing solution optimized for a base metal, such as interconnects. This enables efficient formation of a high-quality protective film (metal film) on the surfaces of interconnects without deterioration of the electrical properties of the interconnects.

What is claimed is:

1. A substrate processing method comprising:
cleaning a surface of a substrate having a base metal formed in the surface with a cleaning solution comprising an aqueous solution of a carboxyl group-containing organic acid or its salt and a surfactant as an additive;
bringing the cleaned surface of the substrate into contact with a processing solution comprising a mixture of the cleaning solution and a solution containing a catalyst metal ion, thereby applying the catalyst to the surface of the substrate; and
forming a metal film by electroless plating on the catalyst-applied surface of the substrate.

2. The substrate processing method according to claim 1, wherein the base metal is embedded interconnects which have been formed by embedding of an interconnect material in interconnect recesses provided in the surface of the substrate, followed by flattening by CMP.

3. The substrate processing method according to claim 1, wherein the catalyst metal ion is a palladium ion, and the solution containing a catalyst metal ion is one prepared by dissolving a palladium salt in an aqueous solution of an inorganic or organic acid.

4. The substrate processing method according to claim 1, wherein the carboxyl group-containing organic acid is citric acid, oxalic acid, malic acid, maleic acid, tartaric acid, glutaric acid, adipic acid, pimelic acid, succinic acid, malonic acid, fumaric acid or phthalic acid, or an organic salt thereof.

5. The substrate processing method according to claim 1, wherein the cleaning solution further comprises a second chelating agent having a group other than carboxyl group.

6. The substrate processing method according to claim 5, wherein the second chelating agent is at least one of an amino polycarboxylic acid, phosphonic acid, a condensed phosphoric acid, a diketone, an amine, a halide ion, cyanide ion, thiocyanate ion, thiosulfate ion and ammonium ion.

7. The substrate processing method according to claim 5, wherein the second chelating agent is a polyaminocarboxylic acid or a methylenephosphonic acid, or an ammonium salt thereof.

8. The substrate processing method according to claim 1, wherein the surfactant is an ionic long-chain alkyl ester surfactant.

9. A substrate processing method comprising: pre-processing a surface of a base metal formed in a surface of a substrate with a processing solution containing a catalyst metal ion and a component for forming a complex with the base metal, said component comprising a nitrogen-containing organic compound and/or a carboxyl group-containing organic compound; and a surfactant as an additive.

* * * * *

UNITED STATES PATENT AND TRADEMARK OFFICE
CERTIFICATE OF CORRECTION

PATENT NO. : 7,285,492 B2  
APPLICATION NO. : 11/039967  
DATED : October 23, 2007  
INVENTOR(S) : Xinming Wang et al.

It is certified that error appears in the above-identified patent and that said Letters Patent is hereby corrected as shown below:

In column 34, claim 9, line 51, "additive." should be --additive; forming a metal film by electroless plating selectively on the pre-processed base metal surface.--.

Signed and Sealed this

Twenty Second Day of April, 2008

JON W. DUDAS  
*Director of the United States Patent and Trademark Office*